United States Patent
Choi et al.

(10) Patent No.: US 11,777,531 B2
(45) Date of Patent: *Oct. 3, 2023

(54) METHOD AND APPARATUS FOR HIGH-SPEED DECODING OF LINEAR CODE ON BASIS OF SOFT DECISION

(71) Applicant: IUCF-HYU (INDUSTRY-UNIVERSITY COOPERATION FOUNDATION HANYANG UNIVERSITY), Seoul (KR)

(72) Inventors: Chang Ryoul Choi, Seoul (KR); Je Chang Jeong, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 1 day.

This patent is subject to a terminal disclaimer.

(21) Appl. No.: 17/609,994

(22) PCT Filed: Apr. 14, 2020

(86) PCT No.: PCT/KR2020/005024
§ 371 (c)(1),
(2) Date: Nov. 9, 2021

(87) PCT Pub. No.: WO2020/231020
PCT Pub. Date: Nov. 19, 2020

(65) Prior Publication Data
US 2022/0216886 A1     Jul. 7, 2022

(30) Foreign Application Priority Data

May 10, 2019 (KR) .......................... 10-2019-0054870

(51) Int. Cl.
*G06F 11/00* (2006.01)
*G08C 25/00* (2006.01)
(Continued)

(52) U.S. Cl.
CPC ......... *H03M 13/451* (2013.01); *H03M 13/13* (2013.01); *H03M 13/616* (2013.01)

(58) Field of Classification Search
CPC ... H03M 13/451; H03M 13/13; H03M 13/616
See application file for complete search history.

(56) References Cited

U.S. PATENT DOCUMENTS

2012/0254702 A1    10/2012   Koganei
2015/0263767 A1     9/2015   Shin et al.
(Continued)

FOREIGN PATENT DOCUMENTS

JP            5699737 B2      4/2015
KR    10-2015-0106270 A      9/2015
(Continued)

OTHER PUBLICATIONS

Yingquan Wu et al., "Soft-Decision Decoding of Linear Block Codes Using Preprocessing", ISIT, Jun. 27-Jul. 2, 2004, 1 pg., Chicago, USA.
(Continued)

*Primary Examiner* — Samir W Rizk
(74) *Attorney, Agent, or Firm* — Sughrue Mion, PLLC

(57) ABSTRACT

Disclosed are a method and an apparatus for high-speed decoding of a linear code on the basis of a soft decision. The method for high-speed decoding of a linear code on the basis of a soft decision may comprise the steps of: obtaining an alignment signal by aligning received signals in order of magnitude; obtaining a hard decision signal by making a hard decision on the alignment signal; obtaining a higher-level signal corresponding to most reliable bases (MRB)

(Continued)

from the hard decision signal; obtaining a permuted and corrected codeword candidate by using an error vector according to a current order and the higher signal; calculating a cost for the current order by using a cost function; determining the permuted and corrected codeword candidate as a permuted and corrected codeword according to a result of comparing the calculated cost and the minimum cost; and determining a predefined high-speed condition.

20 Claims, 32 Drawing Sheets

(51) Int. Cl.
    *G06F 11/30*     (2006.01)
    *H03M 13/00*     (2006.01)
    *H04L 1/00*     (2006.01)
    *H03M 13/45*     (2006.01)
    *H03M 13/13*     (2006.01)

(56) References Cited

U.S. PATENT DOCUMENTS

| | | | |
|---|---|---|---|
| 2016/0210190 A1 | 7/2016 | Ha et al. | |
| 2016/0320190 A1* | 11/2016 | Wu | G01S 19/40 |
| 2021/0242883 A1* | 8/2021 | Choi | H03M 13/1111 |
| 2022/0006472 A1* | 1/2022 | Choi | H03M 13/451 |

FOREIGN PATENT DOCUMENTS

| | | |
|---|---|---|
| KR | 10-2016-0090054 A | 7/2016 |
| KR | 10-2017-0005398 A | 1/2017 |
| KR | 10-1775969 B1 | 9/2017 |
| KR | 10-1882620 B1 | 7/2018 |
| KR | 10-2018-0123393 A | 11/2018 |

OTHER PUBLICATIONS

International Search Report for PCT/KR2020/005024 dated, Jul. 14, 2020 (PCT/ISA/210).

* cited by examiner (127,64) BCH Codes, order-1

(127,64) BCH Codes, order-1

(127,64) BCH Codes, order-2

(127,64) BCH Codes, order-2

(127,64) BCH Codes, order-3

(127,64) BCH Codes, order-3

(127,64) BCH Codes, order-4

(127,64) BCH Codes, order-4

(127,64) BCH Codes, order-5

(127,64) BCH Codes, order-5

(127,64) BCH, Proposed2

(127,64) BCH Codes, order-4, Proposed2

(127,64) BCH Codes, order-4, Proposed2

(255,131) BCH Codes, order-1

(255,131) BCH Codes, order-1

(255,131) BCH Codes, order-2

(255,131) BCH Codes, order-2

(255,131) BCH Codes, order-3

(255,131) BCH Codes, order-3

(255,131) BCH Codes, order-4

(255,131) BCH Codes, order-4

(255,131) BCH Codes, Proposed2

(255,131) BCH Codes, Proposed2

(255,131) BCH Codes, order-4, Proposed2

(255,131) BCH Codes, order-4, Proposed2

METHOD AND APPARATUS FOR HIGH-SPEED DECODING OF LINEAR CODE ON BASIS OF SOFT DECISION

TECHNICAL FIELD

The present invention relates to a method and apparatus for fast decoding a linear code based on a soft decision, and more particularly, to a technology for fast coding by omitting some computational processes in a method of fast decoding a linear code based on a soft decision.

BACKGROUND ART

In digital communication, a decision means a threshold value decision according to quantization in a demodulator immediately before a decoder. In this case, as a decision method, there is a hard decision and a soft decision.

The hard decision means that a waveform output by the demodulator is demodulated only into binary signals (e.g., 0 or 1) and then decoded. On the other hand, instead of performing a firm integer decision like the hard decision, the soft decision means that the output from the demodulator is demodulated into quantized signals in two or more stages and then decoded.

The hard decision may cause irrecoverable loss of information at a receiver but requires less data processing and is simply implemented. On the other hand, the soft decision requires more data processing and is more complexly implemented but is used more because it has better decoding performance than the hard decision.

Meanwhile, the process of decoding a soft decision signal into an original signal is performed through a combination of information such as conditional probability or likelihood of the soft decision signal. An ordered statistics decoder (OSD), which is one of these soft-decision-based decoding methods, has attracted a great deal of attention because the OSD exhibits performance that is close to maximum likelihood (ML).

However, since the OSD is similar to a method of finding a codeword most similar to received data among all codewords, a process of checking all combinations is required, so computational complexity is very high. Accordingly, there is a need for a method capable of maintaining high decoding performance while lowering computational complexity.

DISCLOSURE

Technical Problem

In order to solve the above problems, an object of the present invention is to provide a method of fast decoding a linear code based on a soft decision.

In order to solve the above problems, another object of the present invention is to provide an apparatus for fast decoding a linear code based on a soft decision.

Technical Solution

In order to accomplish the above objects, one aspect of the present invention provides a method of fast decoding a linear code based on a soft decision.

The method of fast decoding a linear code based on a soft decision comprises: obtaining an arrangement signal by arranging received signals in order of magnitude; obtaining a hard decision signal by performing a hard decision on the arrangement signal; obtaining a higher signal corresponding to a most reliable base (MRB) from the hard decision signal; obtaining a permuted and corrected codeword candidate using the higher signal and an error vector according to a current order; calculating a cost for the current order using a cost function; determining the permuted and corrected codeword candidate as a permuted and corrected codeword according to a result of comparing the calculated cost with a minimum cost; and determining a predefined speed-up condition.

The obtaining of the permuted and corrected codeword candidate may include multiplying the higher signal and the error vector according to the current order by a permuted generator matrix to obtain the permuted and corrected codeword candidate.

The cost function may be defined as an operation of adding magnitudes of components corresponding to positions where the permuted and corrected codeword candidate and the hard decision signal may have different values in the arrangement signal.

The error vector may have the same length as the MRB and be defined as a vector in which a Hamming weight is the current order.

The determining of the predefined speed-up condition may include calculating a speed-up threshold value by adding a function having a received vector as a factor to a sum of components with a small magnitude among components of the arrangement signal corresponding to the MRB.

The determining of the predefined speed-up condition may further include comparing the calculated speed-up threshold value with the minimum cost.

The method may further comprise, after the comparing, only when the speed-up threshold value is smaller than the minimum cost according to a result of comparison, obtaining the permuted and corrected codeword candidate for a next order of the current order.

The received vector may be a vector obtained by permuting a column vector of the received signal or a vector obtained by permuting the column vector of the received signal in the same order as the permuted generator matrix.

The determining of a predefined speed-up condition may comprise comparing a Hamming distance between the hard decision signal and the permuted and corrected codeword candidate with a preset first threshold value code.

The method may further comprise, after the comparing of the Hamming distance with the preset first threshold value, when the Hamming distance is greater than the preset first threshold value according to a result of the comparison, omitting an operation for the error vector and changing the error vector according to the current order to obtain the permuted and corrected codeword candidate.

The method may further comprise: after the obtaining of the permuted and corrected codeword candidate, comparing a Hamming distance between the hard decision signal and the permuted and corrected codeword candidate with a preset second threshold value; and when the Hamming distance is smaller than the second threshold value, omitting the calculating of the cost and determining the permuted and corrected codeword candidate as the permuted and corrected codeword.

In order to accomplish the above objects, another aspect of the present invention provides an apparatus for fast decoding a linear code based on a soft decision.

The apparatus for fast decoding a linear code based on a soft decision may comprise at least one processor; and a memory configured to store instructions for instructing the at least one processor to perform at least one step.

The at least one step may comprise arranging received signals in order of magnitude to obtain an arrangement signal; performing a hard decision on the arrangement signal to obtain a hard decision signal; obtaining a higher signal corresponding to a most reliable base (MRB) from the hard decision signal; obtaining a permuted and corrected codeword candidate using the higher signal and an error vector according to a current order; calculating a cost for the current order using a cost function; determining the permuted and corrected codeword candidate as a permuted and corrected codeword according to a result of comparing the calculated cost with a minimum cost; and determining a predefined speed-up condition.

The obtaining of the permuted and corrected codeword candidate may include multiplying the higher signal and the error vector according to the current order by a permuted generator matrix to obtain the permuted and corrected codeword candidate.

The cost function may be defined as an operation of adding magnitudes of components corresponding to positions where the permuted and corrected codeword candidate and the hard decision signal may have different values in the arrangement signal.

The error vector may have the same length as the MRB and be defined as a vector in which a Hamming weight is the current order.

The determining of the predefined speed-up condition may include calculating a speed-up threshold value by adding a function having a received vector as a factor to a sum of components with a small magnitude among components of the arrangement signal corresponding to the MRB.

The determining of the predefined speed-up condition may further include comparing the calculated speed-up threshold value with the minimum cost.

The at least one step may further comprise, after the comparing, only when the speed-up threshold value is smaller than the minimum cost according to a result of comparison, obtaining of the permuted and corrected codeword candidate for a next order of the current order performed.

The received vector may be a vector obtained by permuting a column vector of the received signal or a vector obtained by permuting the column vector of the received signal in the same order as the permuted generator matrix.

The apparatus of claim 17, further comprising, after the obtaining of the permuted and corrected codeword candidate, comparing a Hamming distance between the hard decision signal and the permuted and corrected codeword candidate with a preset first threshold value code.

The at least one step may further comprise, after the comparing of the Hamming distance with the preset first threshold value, when the Hamming distance is greater than the preset first threshold value according to a result of the comparison, omitting an operation for the error vector and changing the error vector according to the current order to obtain the permuted and corrected codeword candidate.

The at least one step may further comprise, after the obtaining of the permuted and corrected codeword candidate, comparing a Hamming distance between the hard decision signal and the permuted and corrected codeword candidate with a preset second threshold value; and when the Hamming distance is smaller than the second threshold value, omitting the calculating of the cost and determining the permuted and corrected codeword candidate as the permuted and corrected codeword.

Advantageous Effects

In a case of using a method and apparatus for fast decoding a linear code based on a soft decision according to the present invention as described above, it is possible to reduce computational complexity while maintaining decoding performance according to an ordered statistics decoder (OSD) as much as possible.

BEST MODE

Figure 1:
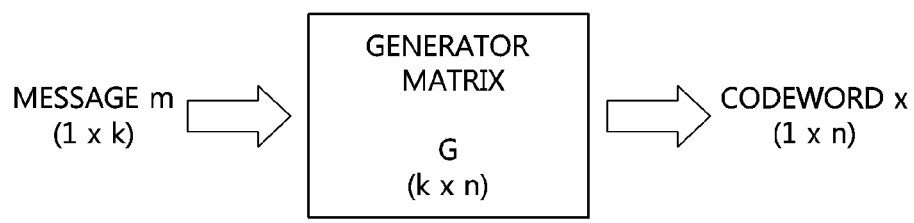
FIG. 1 is an exemplary diagram for describing a concept of linear coding according to an embodiment of the present invention.

Embodiments of the present disclosure are disclosed herein. However, specific structural and functional details disclosed herein are merely representative for purposes of describing embodiments of the present disclosure. Thus, embodiments of the present disclosure may be embodied in many alternate forms and should not be construed as limited to embodiments of the present disclosure set forth herein. Accordingly, while the present disclosure is capable of various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be described in greater detail with reference to the accompanying drawings.

FIG. 1 is an exemplary diagram for describing a concept of linear coding according to an embodiment of the present invention.

Block coding may be a coding method of bundling data in a certain block unit and performing coding and decoding on each block. The linear coding may be a code in which a codeword set forms a linear vector space (or satisfies a linear condition).

Referring to FIG. 1, a general linear coding process may be expressed using a generator matrix G. When a message m to be transmitted is expressed as a vector of 1Xk, a codeword x expressed as a vector of 1Xn can be derived by multiplying a generator matrix having a size of kXn by the message m. Hereinafter, k may be a dimension (or rank of a generator matrix, rank), and n may be a length of a codeword.

Here, the generator matrix for generating the codeword may be determined according to the codeword used. In general, the larger the minimum distance between the codewords, the higher the error correction capability, which is advantageous. Here, the minimum distance may be the smallest distance among Hamming distances between codewords. Also, the Hamming distance may be the number of different symbols between two codewords.

Through the above process, the linearly encoded codeword is transmitted from a transmitting side to a receiving side of a wired/wireless communication system, and the receiving side may recover an original waveform through a demodulator, detect errors mixed with the recovered waveform using a decoder, and restore valid codewords (or data symbols).

Hereinafter, a method and apparatus for fast decoding a linear code based on a soft decision according to an embodiment of the present invention will be described based on these concepts.

In addition, in the following, for convenience of explanation, described is given on the assumption that a transmission channel is additive white Gaussian noise (AWGN) and a modulation method uses binary phase shift keying (BPSK), but it should not be interpreted that the channel or modulation method is limited.

Figure 2:
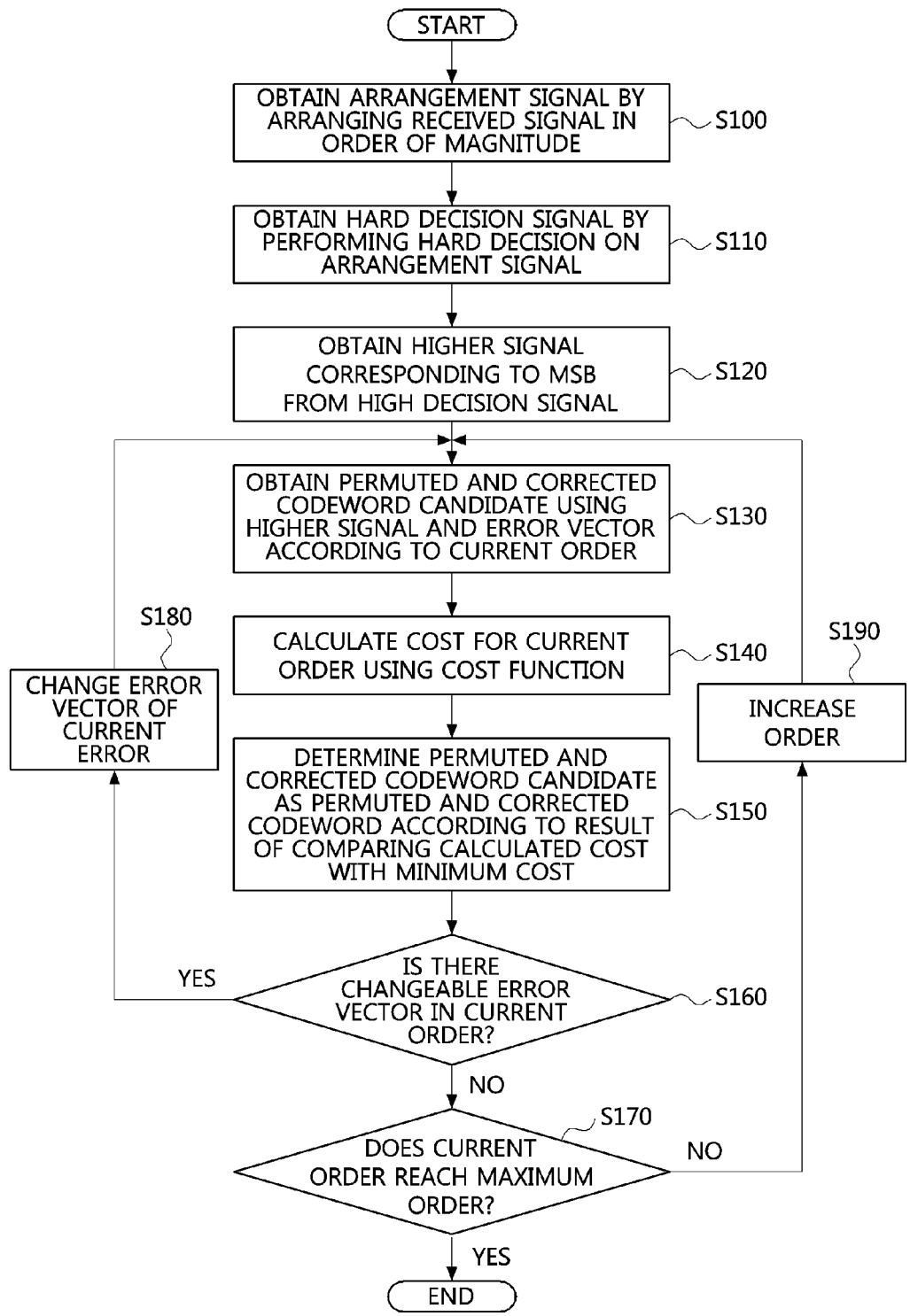
FIG. 2 is a flowchart for describing a method of decoding an ordered statistics decoder (OSD) according to an embodiment of the present invention.

FIG. 2 is a flowchart for describing a method of decoding an ordered statistics decoder (OSD) according to an embodiment of the present invention.

Referring to FIG. 2, in the OSD according to the embodiment of the present invention, an arrangement signal may be obtained by first arranging signals received from the decoder in order of magnitude (S100). For example, when r= $(r_0, r_1, \ldots r_{n-1})$ is a received signal (where n may be the length of the codeword), then absolute values of individual components $r_0, r_1, \ldots, r_{n-1}$ of the received signal are taken, and the individual components $r_0, r_1, \ldots, r_{n-1}$ are arranged in order of magnitude to obtain an arrangement signal y=$(y_0, y_1, \ldots y_{n-1})$ (hereinafter, the arrangement signal may be referred to as y). Here, the arrangement order may be arranged in descending order but is not limited thereto, and the arrangement order is not necessarily arranged in order of magnitude accurately.

After operation S100, it is possible to obtain a hard decision signal by making a hard decision on the arrangement signal y (S110). For example, a hard decision signal Y=$(Y_0, Y_1, \ldots, Y_{n-1})$ may be obtained by performing a hard decision on the arrangement signal y (hereafter, the hard decision signal may be referred to as Y). When the hard decision signal Y is obtained, a higher signal corresponding to most reliable bases (MRBs) may be obtained from the hard decision signal (S120, hereinafter, the higher signal may be referred to as $\alpha$). Specifically, in the hard decision signal, k higher components (where k may be a dimension described in FIG. 1) with a large magnitude are classified as the MRBs and the remaining n-k components are classified as least reliable bases (LRBs), and a higher signal $\alpha$ with k higher components may be obtained.

After operation S120, a permuted and corrected codeword candidate may be obtained using an error vector according to a higher signal $\alpha$ and an order (hereinafter, denoted by o) (S130). Specifically, for example, when an error vector for any order o is $k_o$ and the permuted generator matrix is G', a permuted and corrected codeword candidate $E_o$ for any order o may be defined as in Equation 1 below.

$$(\alpha + k_0) \cdot G' = \alpha G' + k_0 G' = E_o$$

Referring to Equation 1, the permuted and corrected codeword candidate $E_0$ may be obtained by multiplying the higher signal $\alpha$ and an error vector $k_0$ according to an order by the permuted generator matrix G'. In a more detailed expression, the permuted and corrected codeword candidate $E_o$ may be obtained by multiplying a value obtained by adding the higher signal $\alpha$ and the error vector $k_o$ according to the order by the permuted generator matrix G' or may be obtained by a sum of a value obtained by multiplying the higher signal $\alpha$ by the permuted generator matrix G' and a value obtained by multiplying the error vector $k_0$ by the permuted generator matrix G'. In this case, the permuted generator matrix may be obtained by permuting a column of the generator matrix G described in FIG. 1 in the same order as the arrangement order that generated the previous arrangement signal y and performing Gaussian elimination. Also, the permuted and corrected codeword candidate has a permuted order according to a permutation order of the permuted generator matrix and may be defined as a candidate of a corrected codeword. In this case, the permuted generator matrix G' may have the form of Equation 2 below.

$$G'[I\ P] \qquad \text{[Equation 2]}$$

Referring to Equation 2, I may be an identity matrix having a size of kXk, and P may be a matrix having a size of k×(n−k). Here, when the form is not the same as in Equation 2, the form according to Equation 2 may be derived by appropriately permuting the column of the generator matrix G illustrated in FIG. 1. In this case, the order of permutation for deriving the permuted generator matrix G' and the order of arrangement signals may be the same.

Meanwhile, the error vector is interpreted as a vector (or a vector indicating a component predicted to be different from the hard decision signal from the permuted and corrected codeword candidate among the components corresponding to the MRB of the arrangement signal) indicating a component predicted to have an error. Specifically, the error vector may be defined as a vector that has the same length (length of k) as the MRB and the Hamming weight (the number of non-zero components within the codeword) of the current order (o). For example, when the order is 0, the error vector $k_0$ has a Hamming weight of 0 and thus may be derived as in Equation 3 below.

$$k_0(0,0,0,\ldots,0) \qquad \text{[Equation 3]}$$

That is, an error vector of order 0 may be a vector in which k components are all 0. In addition, an error vector of order 1 may be derived as in Equation 4 below.

$$k_1=(0,1,0,\ldots,0) \qquad \text{[Equation 4]}$$

In Equation 4, a position of a component having a value of 1 or a position of a component predicted to have an error may vary. That is, the number of error vectors $k_1$ may be derived as a total of k depending on the selected position. In addition, an error vector $k_2$ for the case of order 2 can be selected at two positions from among the MRBs and be allowed only the component values for the selected positions to have 1 (or a non-zero predetermined value) and the remaining component values to have 0.

The permuted and corrected codeword candidate is a candidate that has the potential to become a permuted and corrected codeword whose order is permuted like the permuted generator matrix and may be evaluated through a cost function according to the error vector. For example, when the error vector is a vector in which a $j^{th}$ component has 1 as in Equation 4 (when it is predicted that the permuted and corrected codeword candidate and the hard decision signal are different from the $j^{th}$ component among the components corresponding to the MRB of the arrangement signal), the cost function may be defined as in Equation 5 below.

$$s' = |y_j| + \sum_{\substack{i=k \\ Y_i \neq E_i}}^{n-1} |y_i| \qquad \text{[Equation 5]}$$

Referring to Equation 5, the cost function may be defined as a value obtained by adding the magnitude of the $j^{th}$ component in the arrangement signal y and among components corresponding to n−k LRBs, magnitudes of components corresponding to positions where a permuted and corrected codeword candidate $E_i$ and a hard decision signal $Y_i$ have different values. Also, as in Equation 3, the cost function for the error vector in which all components are 0 has no component indicated by the error vector and thus may be defined as in Equation 6 below.

$$s = \sum_{\substack{i=k \\ Y_i \neq E_i}}^{n-1} |y_i| \qquad \text{[Equation 6]}$$

Specifically, referring to Equation 6, according to Equation 3, the cost function for the error vector of order 0 may be defined as a value obtained by adding, among components corresponding to n−k LRBs, the magnitudes of the components corresponding to the positions where the permuted and corrected codeword candidate and the hard decision signal have different values.

In the same way as in Equations 5 and 6, when non-zero components indicated by an error vector of order 2 are a $1^{st}$ component and an $m^{th}$ component, the cost function may be defined as in Equation 7 below.

$$s' = |y_l| + |y_m| + \sum_{\substack{i=k \\ Y_i \neq E_i}}^{n-1} |y_i| \qquad \text{[Equation 7]}$$

That is, by summarizing Equations 5 to 7, the cost function may be defined as an operation of adding all the magnitudes of the components corresponding to the positions where the permuted and corrected codeword candidate and the hard decision signal have different values in the arrangement signal.

Therefore, after operation S130, the cost for the current order may be calculated using the cost function (S140). Here, the current order may be a variable that starts from 0 and increases by one every time operation S130 passes.

When the cost for the current order is calculated in operation S140, the permuted and corrected codeword candidate may be determined as a permuted and corrected codeword according to the result of comparing the calculated cost with the minimum cost (S150). Here, the minimum cost may be a minimum value among costs calculated from the order 0 to the current order. Describing operation S150 in more detail, when the calculated cost is less than the minimum cost, the permuted and corrected codeword candidate may be determined as the permuted and corrected codeword. In addition, when the cost calculated in operation S150 is smaller than the minimum cost, it may include updating the calculated cost to the minimum cost. Meanwhile, when the order is 0, the cost calculated according to operation S140 may be determined as the minimum cost, and the permuted and corrected codeword candidate may be determined as the permuted and corrected codeword.

After operation S150, it is determined whether there is a changeable error vector in the current order (S160), and when there is a changeable error vector in the current order, the error vector is changed (S180), so the process according to operation S130 may be performed again. Here, the change of the error vector may be performed by changing the position of the non-zero components (or 1 component) in the error vector.

After operation S160, it is determined whether the current order has reached a preset maximum order (S170), and when the current order reaches the maximum order, the coding process may be terminated. However, when the current order does not reach the maximum order, the current order is increased by one (S190), and operation S130 may be performed again. Here, the maximum order is a value that may be input by a user and may generally be derived by the following Equation (8).

$$\min\left(k \cdot \left\lfloor \frac{d}{4} \right\rfloor\right) \quad \text{[Equation 8]}$$

In Equation 8, d may be a minimum distance of a codeword, and k may be a dimension.

Figure 3:
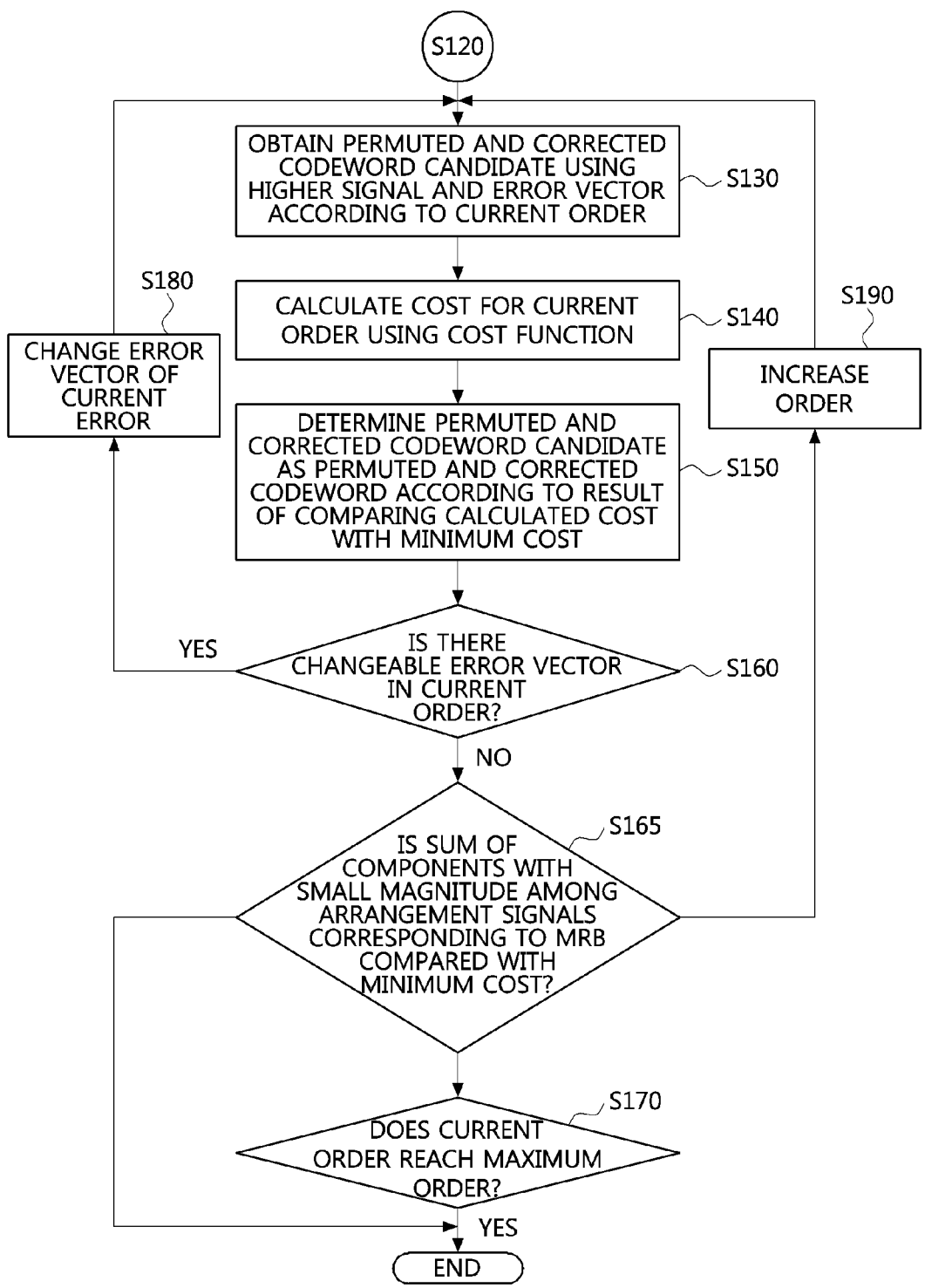
FIG. 3 is a flowchart for describing a method of decoding a probabilistic necessary condition (PNC) according to an embodiment of the present invention.

FIG. 3 is a flowchart for describing a method of decoding a probabilistic necessary condition (PNC) according to an embodiment of the present invention.

Since the OSD described in FIG. 2 continuously calculates a cost function up to a preset maximum order and derives the permuted and corrected codeword candidate, there is a problem in that computational complexity is high and unnecessary operations are repeatedly performed.

In order to reduce the computational complexity, a method of fast decoding by omitting an operation for a subsequent order even when the maximum order is not reached may be considered. In this case, the PNC method is a method of determining an error correction codeword only from the results investigated so far when there is no possibility that a cost lower than the minimum cost exists even when the order increases.

Referring to FIG. 3, the PNC performs up to operation S160 illustrated FIG. 2 and, instead of determining whether the current order reaches the maximum order (S170), may first perform the determination according to operation S165. That is, in operation S165, among the components of the arrangement signal corresponding to the MRB, the sum of components with a small magnitude (hereinafter, may be referred to as a speed-up threshold value) may be compared with the minimum cost determined up to the current order (S165). Here, since the number of components corresponding to the operation of the cost function for the next order of the current order needs to be considered, the number of components with a small magnitude may be selected by one more than the current order and added to each other.

For example, when the current order is o, a speed-up threshold value $S_{PNC}$ for determining whether to perform an operation on the next order o+1 may be defined as in Equation 9 below.

$$S_{PNC(o+1)} = \sum_{j=k-o-1}^{k-1} |y_j| \quad \text{[Equation 9]}$$

Referring to Equation 9, when the arrangement signals are arranged in descending order, the speed-up threshold value $S_{PNC}$ may be determined by adding o+1 components backwards from a $(k-1)^{th}$ component which is the last component among the components corresponding to the MRB of the arrangement signal. On the other hand, when the arrangement signals are arranged in ascending order, j=0 to j=o may be added.

As a result of comparison in operation S165, when the sum of the smaller components is greater than the minimum cost, there is no or very low possibility of becoming an error correction codeword because subsequent orders are bound to be greater than the minimum cost according to the current order. Therefore, as a result of comparison in operation S165, when the sum of components with a small magnitude is greater than the minimum cost, the operations (S130 to S150) of repeating the operation by increasing the order (S190) may be omitted, and the decoding may be terminated.

Figure 4:
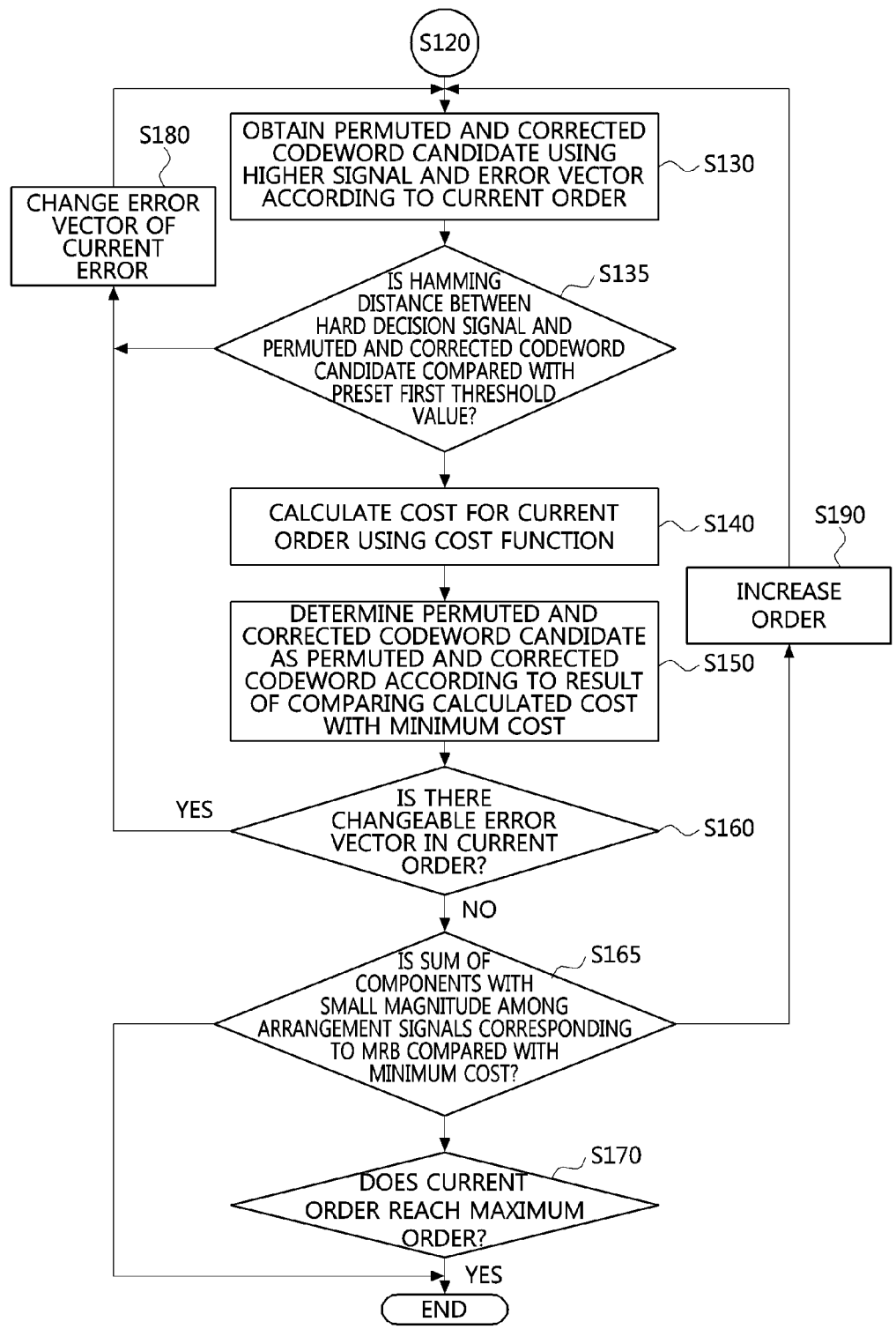
FIG. 4 is a flowchart for describing a method of decoding probabilistic sufficient conditions (PSC) according to an embodiment of the present invention.

FIG. 4 is a flowchart for describing a method of decoding probabilistic sufficient conditions (PSC) according to an embodiment of the present invention.

According to an embodiment of the present invention, it is possible to provide another embodiment (probabilistic sufficient conditions (PSC)) for reducing the amount of computation by improving the OSD illustrated in FIG. 2.

Referring to FIG. 4, after performing operation S130 illustrated in FIG. 2, the PSC may perform a process according to operation S135 instead of operation S140. That is, in operation S135, the Hamming distance between the hard decision signal Y and the permuted and corrected codeword candidate $E_o$ according to the current order o is compared with a preset first threshold value (S135), and as the result of comparison, the operations (S140 and S150) for the current error vector are omitted and the error vector of the current order is changed (S180) so that the error correction candidate may be obtained (S130).

Specifically, when the Hamming distance between the hard decision signal and the permuted and corrected codeword is greater than (or greater than or equal to) the preset first threshold value, the permuted error correction code is unlikely to become an actual error correction codeword, so the operations on the current error vector may be omitted and other candidate words of the current order may be calculated.

Figure 5:
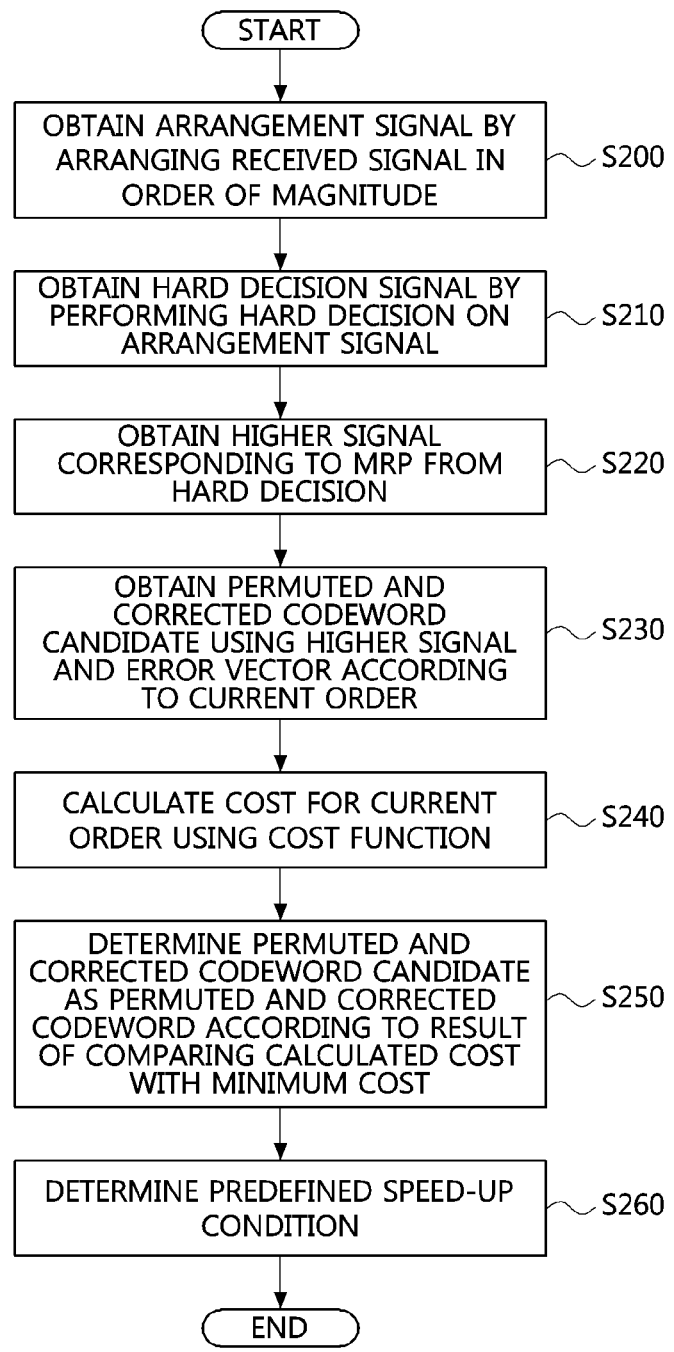
FIG. 5 is a flowchart for a method of fast decoding a linear code based on a soft decision according to an embodiment of the present invention.
Figure 6A:
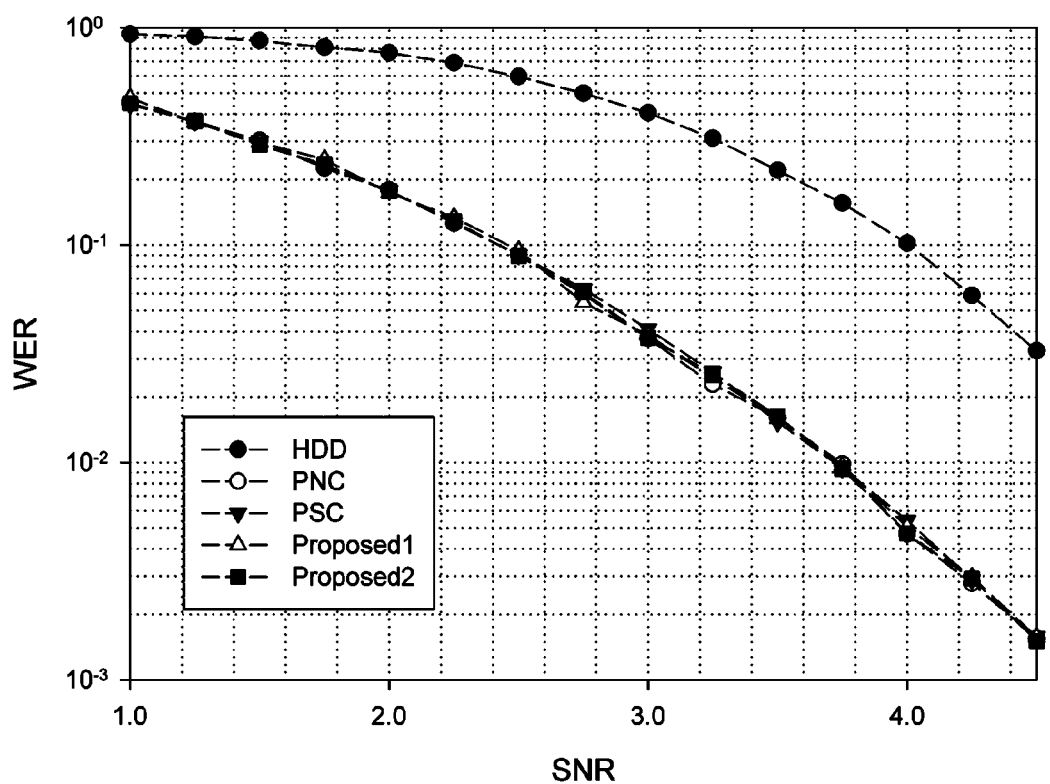
FIGS. 6A to 6J are graphs in which decoding performance and speed of the proposed methods according to an embodiment of the present invention are analyzed for each order.
Figure 6B:
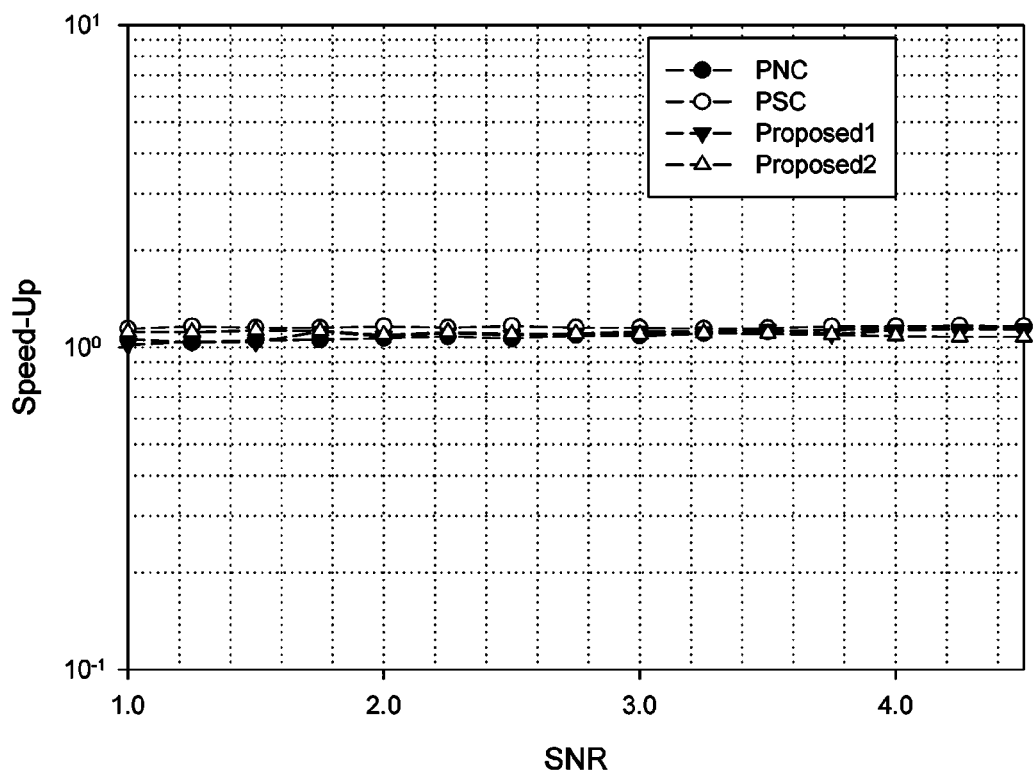
Figure 6C:
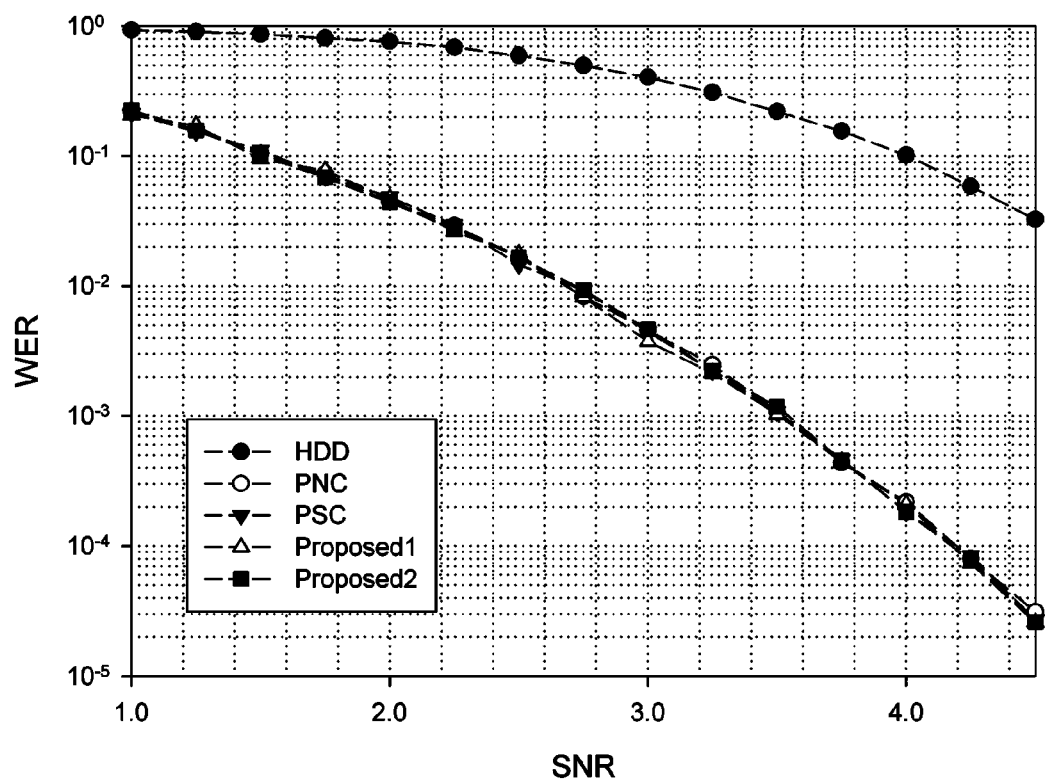
Figure 6D:
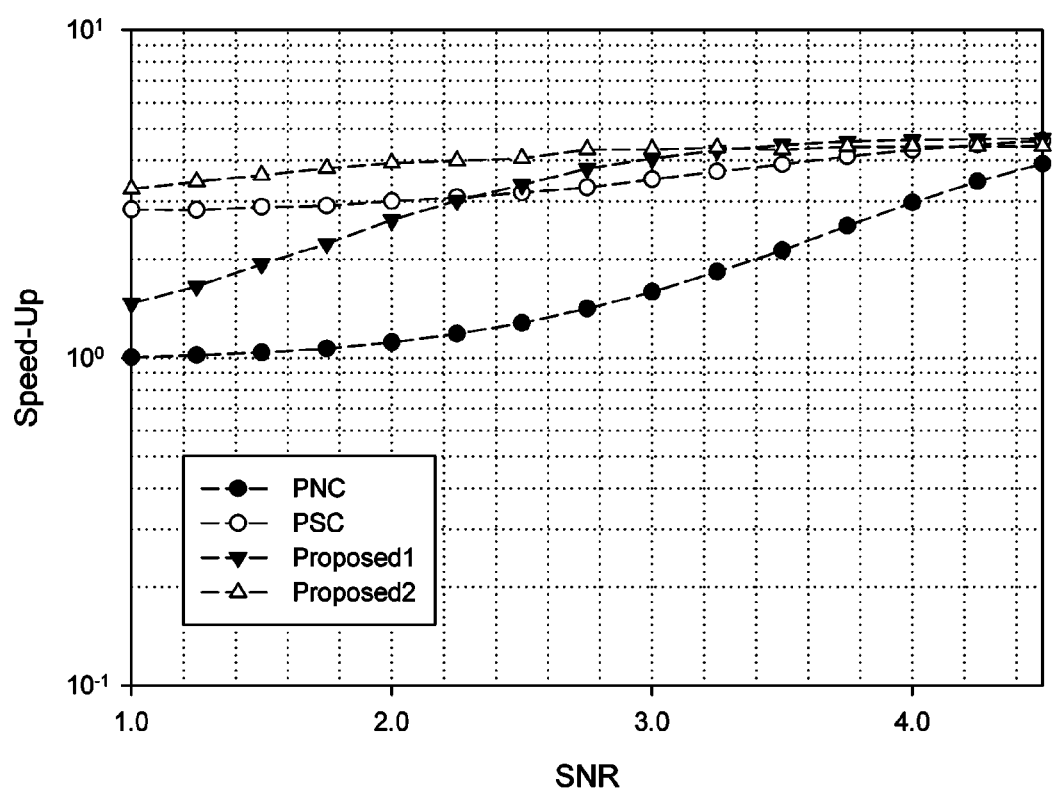
Figure 6E:
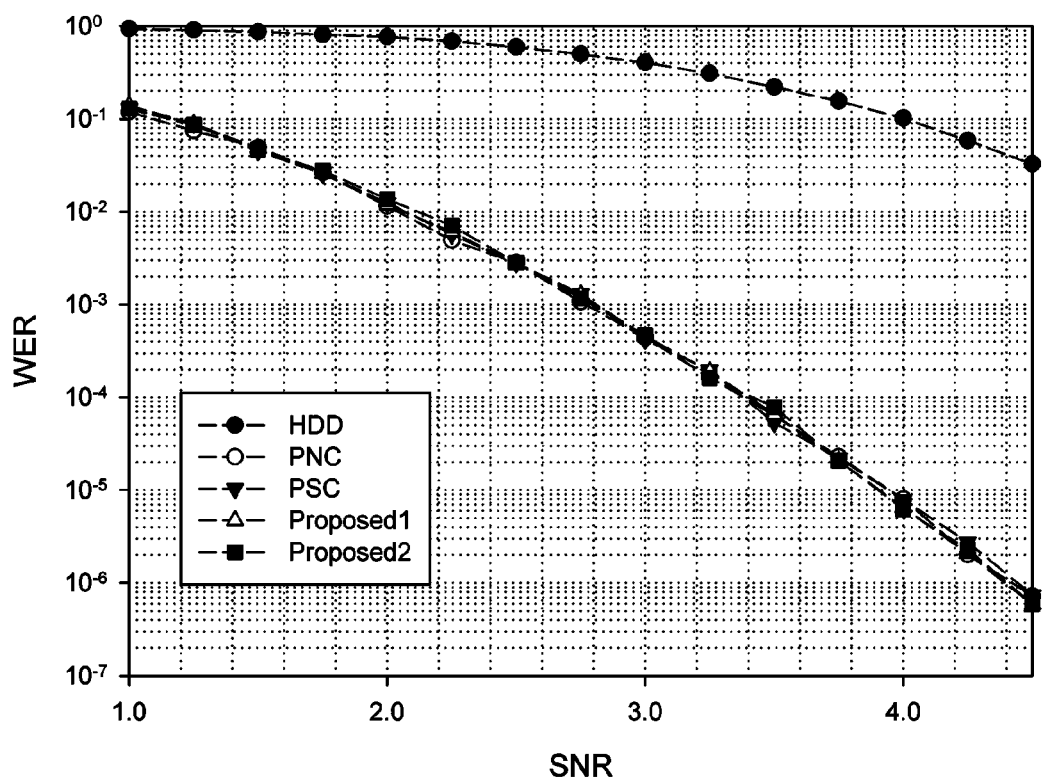
Figure 6F:
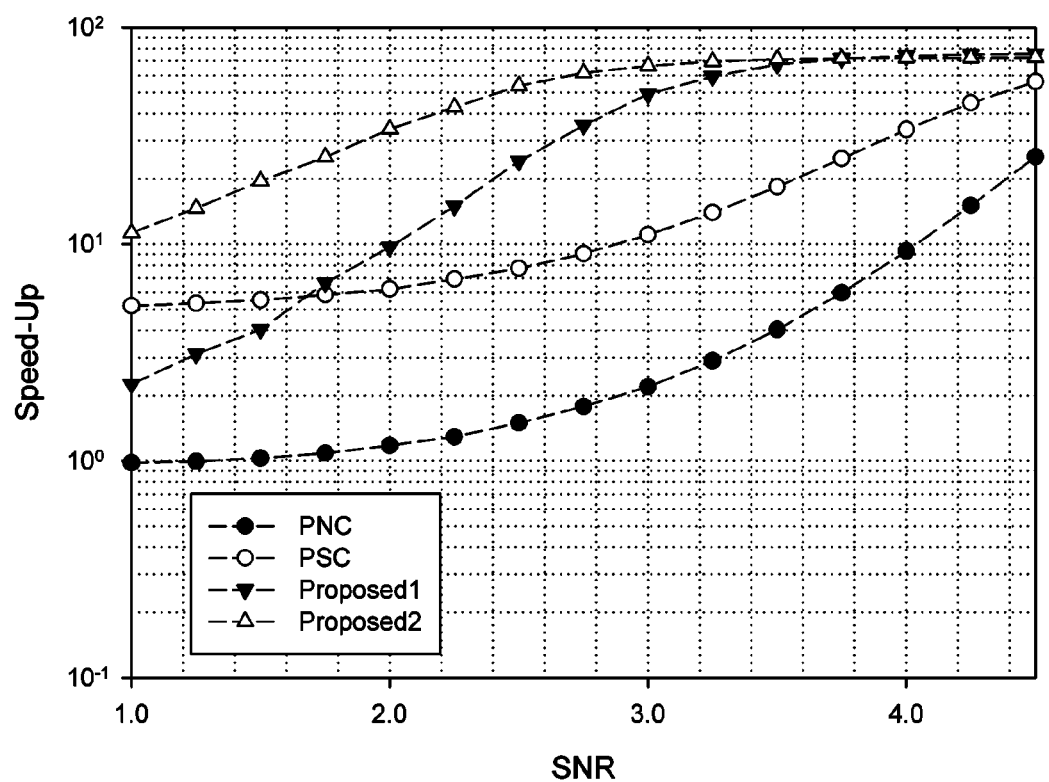
Figure 6G:
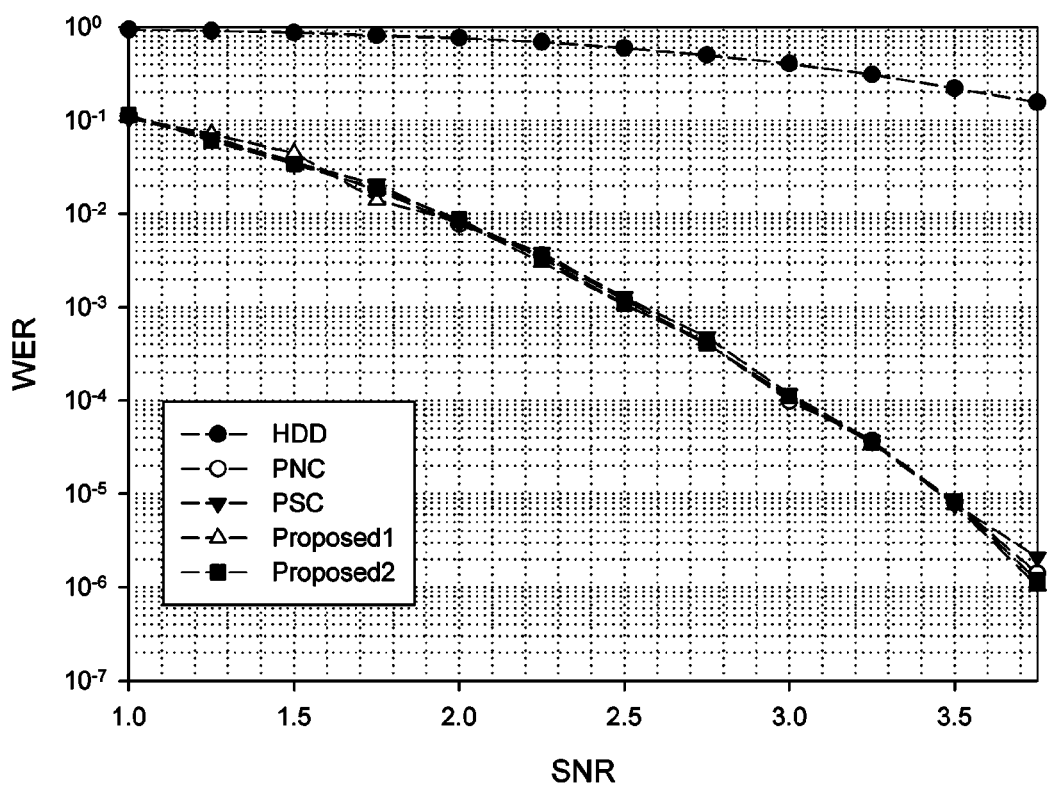
Figure 6H:
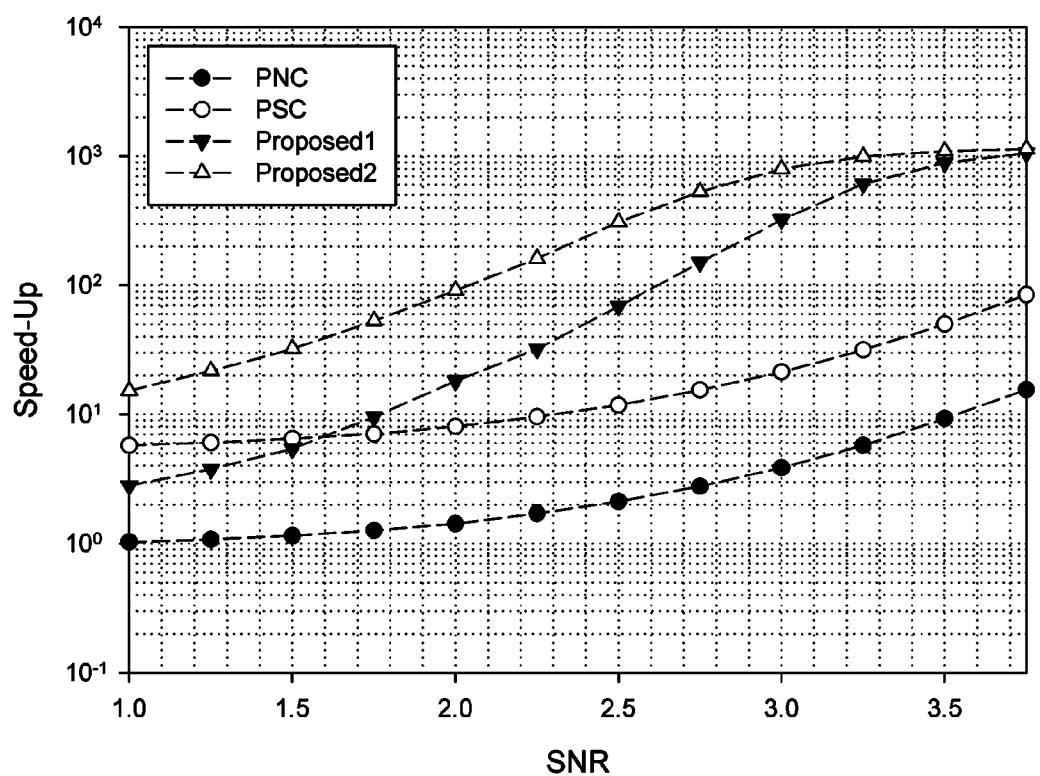
Figure 6I:
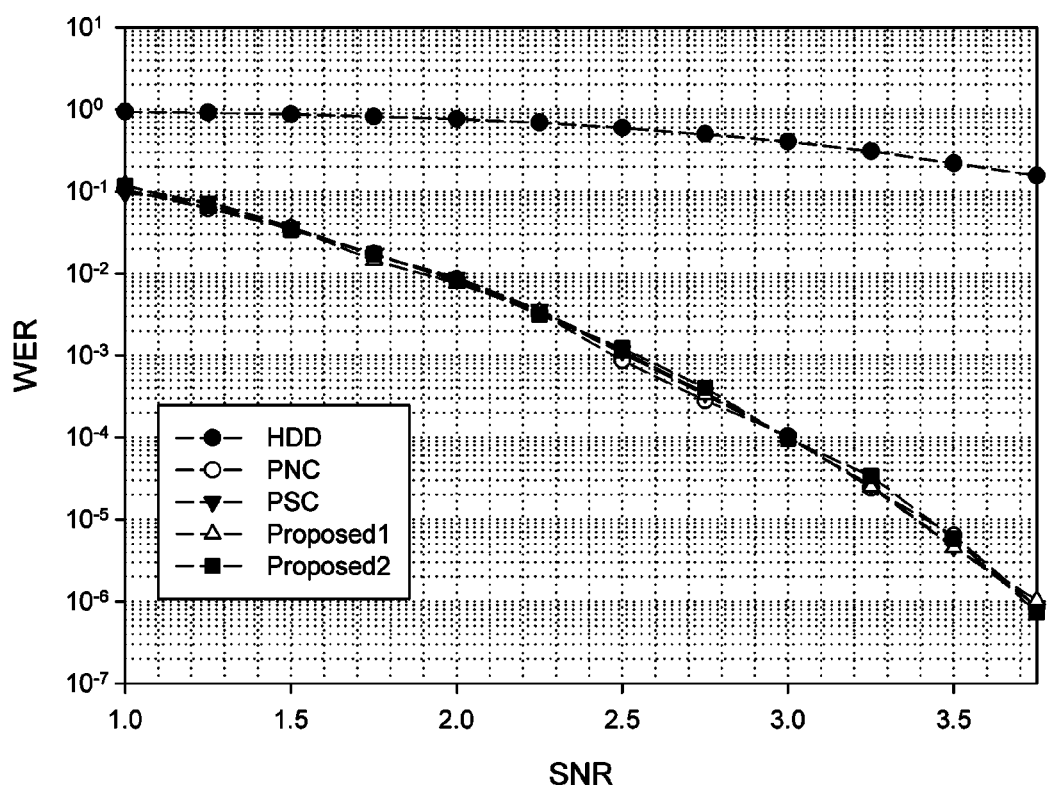
Figure 6J:
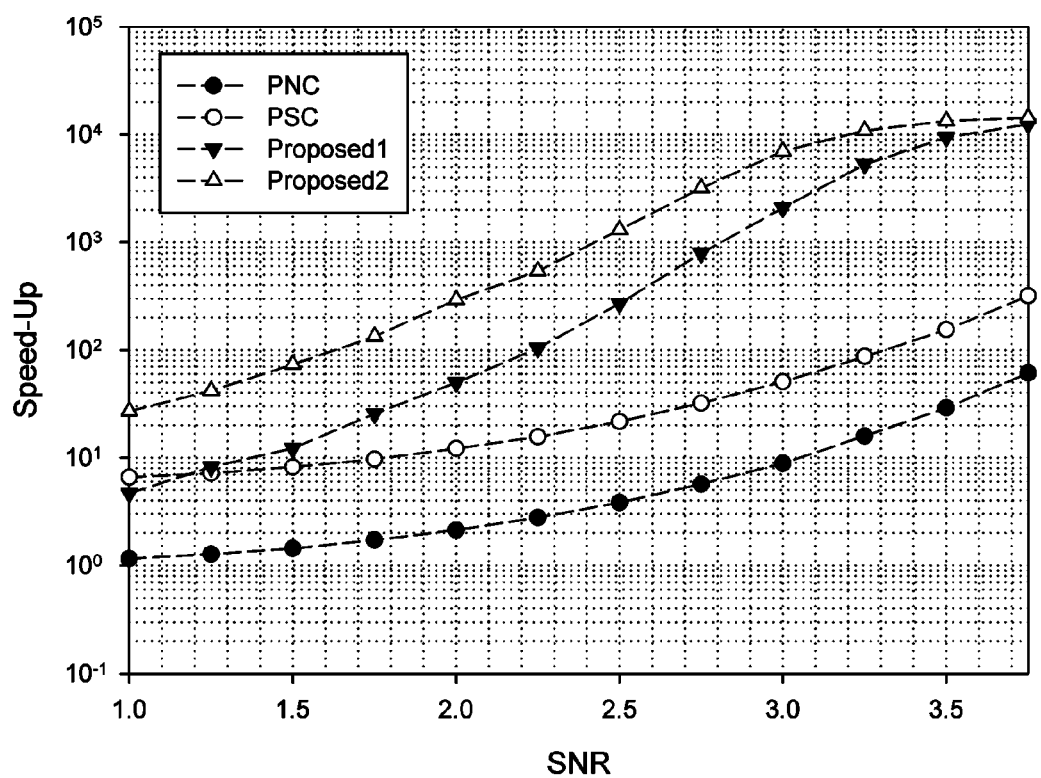

FIG. 5 is a flowchart for a method of fast decoding a linear code based on a soft decision according to an embodiment of the present invention.

Referring to FIG. 5, a method of fast decoding a linear code based on a soft decision includes obtaining an arrangement signal by arranging received signals in order of magnitude (S200), obtaining a hard decision signal by performing a hard decision on the arrangement signal (S210), obtaining a higher signal corresponding to MRBs from the hard decision signal (S220), obtaining a permuted and corrected codeword candidate using the higher signal and an error vector according to a current order (S230), calculating a cost for the current order using a cost function (S240), determining the permuted and corrected codeword candidate as a permuted and corrected codeword according to a result of comparing the calculated cost with a minimum cost (S250), and determining a predefined speed-up condition (S260).

The obtaining of the permuted and corrected codeword candidate (S230) may include obtaining a permuted and corrected codeword candidate by multiplying the higher signal and the error vector according to the current order by a permuted generator matrix. For example, the permuted and corrected codeword candidate may be obtained according to Equation 1 above.

The cost function may be defined as an operation of adding all the magnitudes of components corresponding to positions where the permuted and corrected codeword candidate and the hard decision signal have different values in the arrangement signal. For example, the cost function may refer to Equations 5 to 7.

The error vector may be defined as a vector having the same length as the MRB and having the Hamming weight of the current order. For example, the error vector may refer to Equations 3 to 4.

The determining of the predefined speed-up condition (S260) may include calculating a speed-up threshold value by adding components with a small size among the components of the arrangement signal corresponding to the MRB and comparing the calculated speed-up threshold value with the minimum cost. For example, the determining of the predefined speed-up condition (S260) may refer to the description according to FIG. 3, and the speed-up threshold value may refer to Equation 9.

After the comparing, only when the speed-up threshold value is smaller than the minimum cost according to a result of comparison, may the obtaining of the permuted and corrected codeword candidate for a next order of the current order be performed.

After the obtaining of the permuted and corrected codeword candidate, the method of fast decoding a linear code based on a soft decision may include comparing a Hamming distance between the hard decision signal and the permuted and corrected codeword candidate with a preset first threshold value code. For example, the comparing of the Hamming distance with a preset first threshold value may refer to the description of FIG. 4.

After the comparing of the Hamming distance with the preset first threshold value, when as the result of the comparison, the Hamming distance is greater than the preset first threshold value, the obtaining of the permuted and corrected codeword candidate is performed by omitting an operation for the error vector and changing the error vector according to the current order. In more detail, reference may be made to the description according to FIG. 4.

Meanwhile, when performing operation S130 for the next order o+1 is determined as a result of determining operation S165 as the predefined speed-up condition for the current order o by applying the PNC illustrated in FIG. 3, in the o+1 order, the cost calculated in operation S140 may be represented as in Equation 10 below.

$$s_{o+1} = \sum_{j=1}^{o+1} |y_{ij}| + \gamma \qquad \text{[Equation 10]}$$

Referring to Equation 10, a front end portion is an operation of adding the magnitudes of o+1 components indicated by the error vector in the arrangement signal y according to the MRB and may correspond to a front end portion in Equations 5 to 7. In addition, a rear end portion in Equation 10 is a partial sum for reliability of symbols corresponding to the LRBs and may correspond to a rear end portion in Equations 5 to 7.

In general, since the LRBs are values with low reliability, an error probability is higher than that of the components corresponding to the MRBs. Accordingly, γ in Equation 10 may be expected to have a value greater than 0. Using this point, the speed-up threshold value (threshold value for determining whether to omit the operation for the next order o+1) defined in Equation 9 may be changed as shown in Equation 11 below.

$$S_{proposed(o+1)} = S_{PNC(o+1)} + f(SNR \text{ code}, o+1) \qquad \text{[Equation 11]}$$

Referring to Equation 11, a newly defined speed-up threshold value $S_{proposed}$ may be defined as a value obtained by adding a function f having a signal to noise ratio (SNR), an order, and an error correction code as factors to a speed-up threshold value $S_{PNC}$ defined in Equation 9.

Accordingly, the calculating of the speed-up threshold value may include calculating the speed-up threshold value by adding a function having the SNR, the order, and the error correction code as the factors to the sum of the components with a small magnitude.

Meanwhile, the speed-up threshold value (threshold value for determining whether to omit the operation for the next order o+1) defined in Equation 9 may be changed as shown in Equation 12 below.

$$S_{proposed(o+1)} = S_{PNC(o+1)} + f'(\text{received vector}) \qquad \text{[Equation 12]}$$

Referring to Equation 12, the newly defined speed-up threshold value $S_{proposed}$ may be defined as a value obtained by adding a function f' having a received vector as a factor to the speed-up threshold value $S_{PNC}$ defined in Equation 9.

Here, the received vector may be a column vector of the received signal or a vector obtained by permuting the column vector of the received signal in the same order as a permuted generator matrix G'.

Here, the function f' having the received vector as the factor may include an operation of adding all components (components of vectors calculated with a matrix P included in the permuted generator matrix G' according to Equation 2) of vectors corresponding to a parity of the received vector or all components corresponding to the LRB of the received vector, or adding all components of the received vectors, and may further include an operation of multiplying an operation of multiplying the addition operation by a proportional constant.

Accordingly, the calculating of the speed-up threshold value may include calculating the speed-up threshold value by adding the function having the received vector as the factor to the sum of the components with a small magnitude.

Meanwhile, a preset second threshold value may be used by replacing or adding the comparing of the Hamming distance with the preset first threshold value. Specifically, after obtaining the permuted and corrected codeword candidate (S230) (or after comparing with the preset first threshold value), the method of fast decoding a linear code based on a soft decision may further include comparing a Hamming distance between the hard decision signal and the permuted and corrected codeword candidate with a preset second threshold value, and when the Hamming distance is smaller than the second threshold value, determining the permuted and corrected codeword candidate as the permuted and corrected codeword as soon as the calculating of the cost is omitted. That is, when the Hamming distance is smaller than the second threshold value, the decoding procedure may be terminated by determining the permuted and corrected codeword candidate as the permuted and corrected codeword as soon as all subsequent processes including the calculating of the cost are omitted.

FIGS. 6A to 6J are graphs in which decoding performance and speed of the proposed methods according to an embodiment of the present invention are analyzed for each order.

In the following graphs, hard decision decoding (HDD) means general hard decision-based decoding, the PNC means a case where operation S165 illustrated in FIG. 3 is applied, and the PSC means a case where operation S135 illustrated in FIG. 4 is additionally applied to the PNC. In addition, proposed 1 (method 1) may refer to a method of applying a process of determining a speed-up condition using a speed-up threshold value newly defined according to the above Equation 11 and omitting an operation of calculating cost by comparing a second threshold value with a Hamming distance, in the flowchart illustrated in FIG. 5.

In addition, proposed 2 (method 2) refers to a method of applying operation S135 illustrated in FIG. 4 in addition to the method 1 to omit the operation for the current error vector.

In the codeword used in FIGS. 6A to 6J, a Bose-Chaudhuri-Hocquenghem (BCH) code having a length n of 127, a dimension k of 64, and a minimum distance d of 21 is used. In addition, in the HDD, all errors less than or equal to 10 are corrected considering that the minimum distance d is 21 points. In addition, in the graph, a vertical axis indicates a word error rate (WER) or a decoding speed (speed-up) indicating decoding performance. In addition, in the graph, a horizontal axis represents the SNR. In this case, it is a relative indication of how fast the decoding speed is compared to an ordered statistics decoder-full search (OSD-FS) algorithm described in FIG. 2. In each experiment, all data was quantized into 7 bits, and the preset first threshold value according to the PSC of FIG. 4 is set to 25, and the second threshold value according to the description of FIG. 5 is set to 10. In addition, in the method 1 (proposed 1) and the method 2 (proposed 2), values of the function f having the SNR, the order, and the error correction code as the factors are 346.5, 346.5, 321.3, 270.9, and 270.9 for orders 1 to 5, respectively.

Referring to FIGS. 6A to 6J, a result of comparing the decoding performance and speed for orders 1 to 5 may be confirmed. As can be seen from the graph, the method 1 and the method 2 are substantially identical to the PNC and the PSC in terms of the decoding performance. In addition, in the decoding speed, the methods 1 and 2 are definitely faster than the PNC and PSC. In the case of the method 1, although there is a section in which the decoding speed is slower than that of PSC at low SNR, it can be seen that the decoding speed quickly converges to the decoding speed of the method 2 as the SNR increases. It can be seen that the method 2 shows a significantly faster decoding speed than all other methods.

Specifically, the methods 1 and 2 are up to about 13770 times faster (method 1) and 14609 times (method 2) faster than the OSD-FS for each order, and up to about 336 times (method 1) faster and 797 times (method 2) faster than the PNC. The methods 1 and 2 are up to about 61 times (method 1) faster and 139 times (method 2) faster than the PSC.

FIGS. 7A to 7D are graphs analyzing the decoding performance and speed according to method 2 among the proposed methods according to an embodiment of the present invention.

Figure 7A:
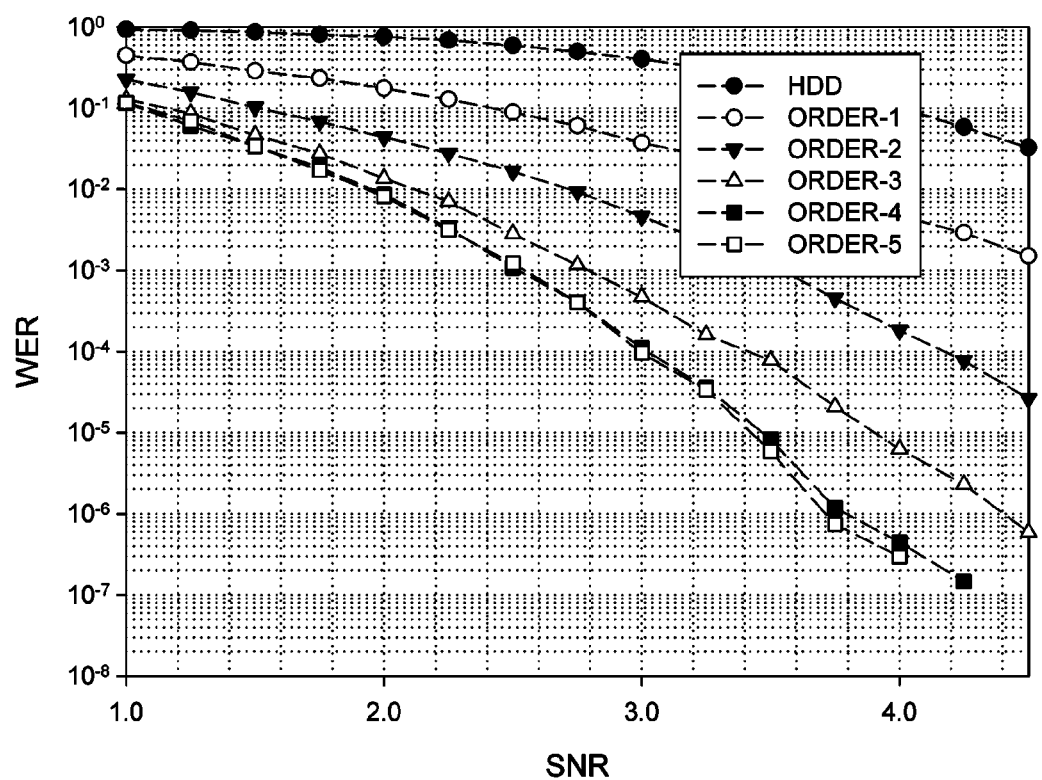
FIGS. 7A to 7D are graphs analyzing the decoding performance and speed according to method 2 among the proposed methods according to an embodiment of the present invention.
Figure 7B:
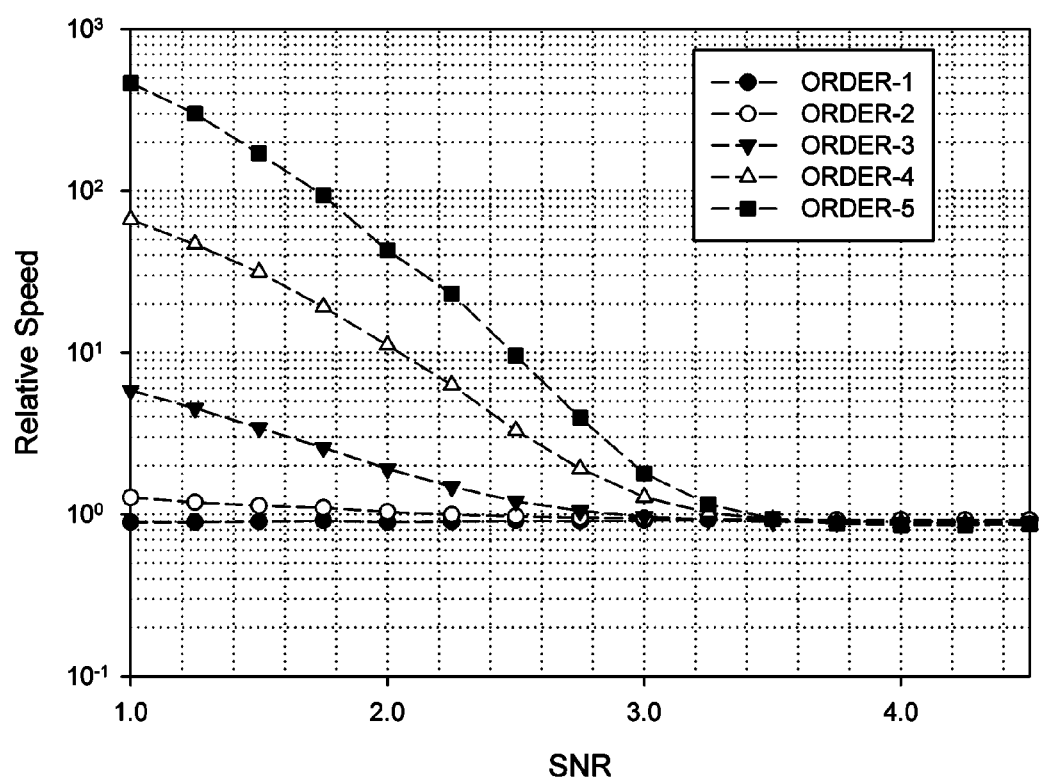

The experimental conditions in FIGS. 7A to 7B are the same as those of FIGS. 6A to 6J.

Referring to FIGS. 7A to 7B, the decoding performance and speed of the method 2 according to each order may be confirmed. Here, the decoding speed (relative speed) illustrated in FIG. 7B represents a relative speed compared to the OSD-FS in order 1. Specifically, the method 2 converges to the speed of the OSD-FS according to order 1 regardless of the order as the SNR increases. That is, when the SNR is above a certain level, the decoding performance is significantly improved as the order increases, and the computational complexity can be minimized.

Figure 7C:
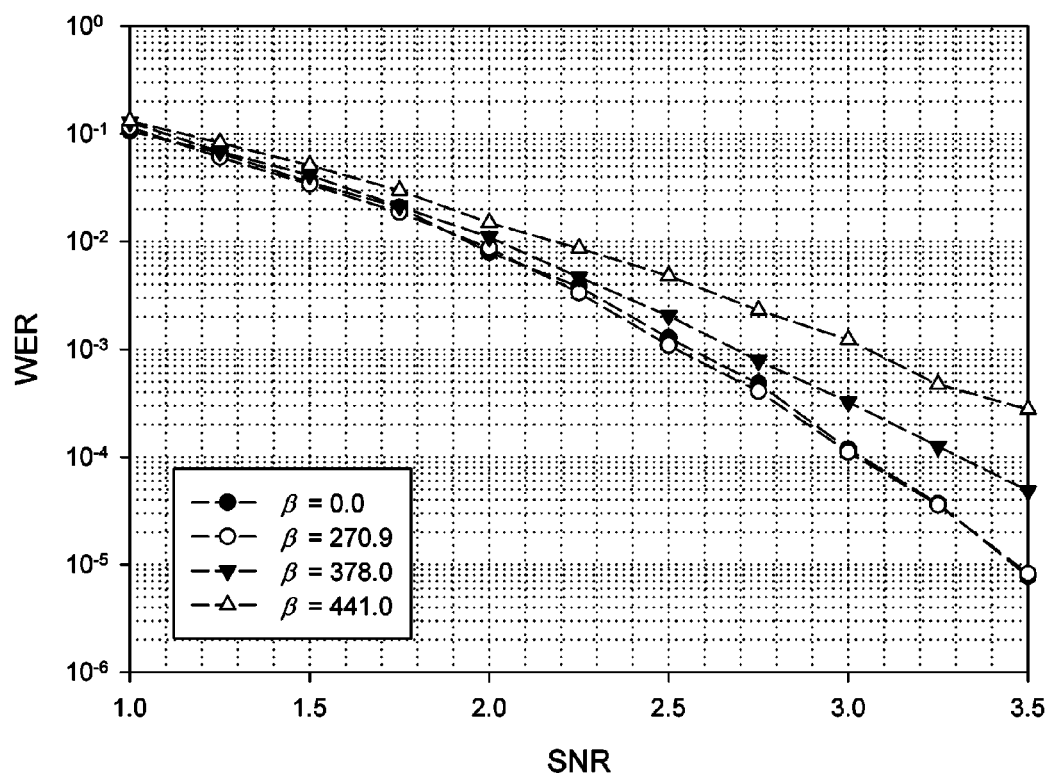
Figure 7D:
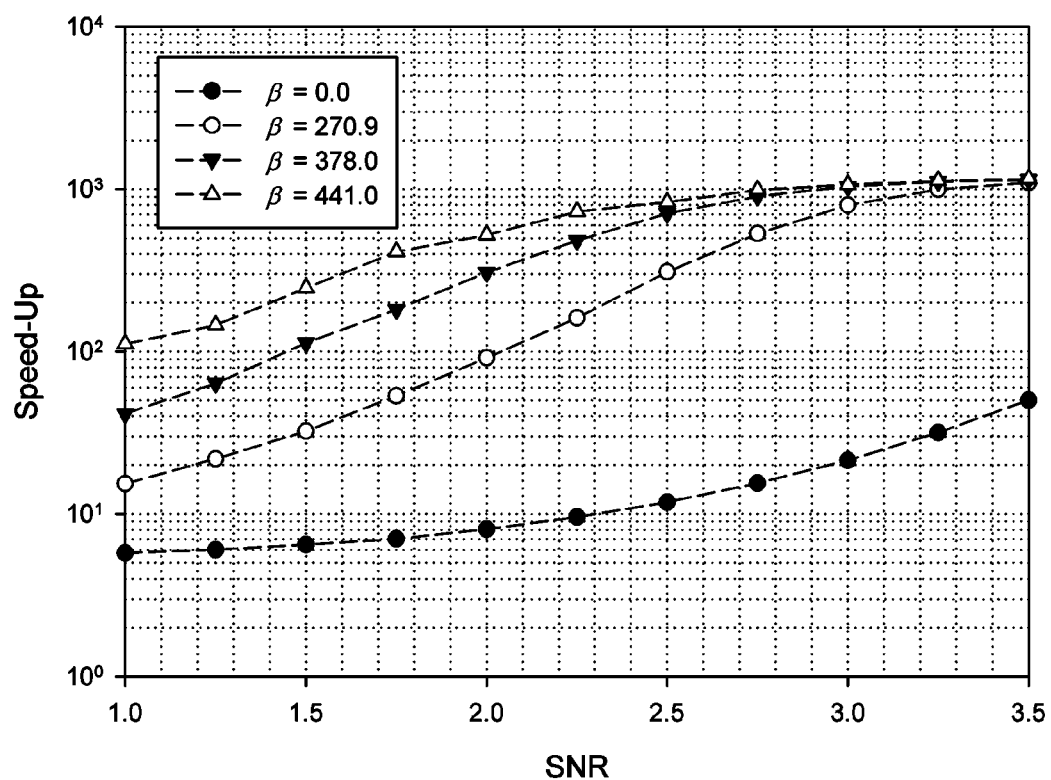
Figure 8A:
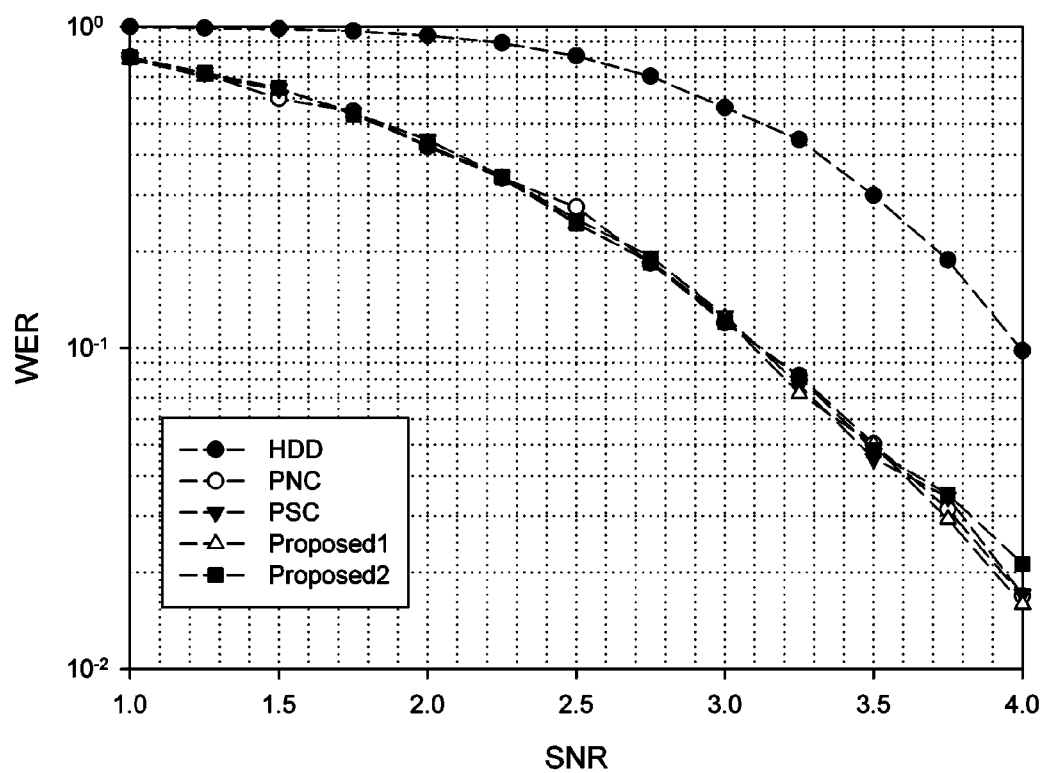
FIGS. 8A to 8H are comparison graphs of the decoding performance and speed of the proposed methods according to an embodiment of the present invention under different experimental conditions.
Figure 8B:
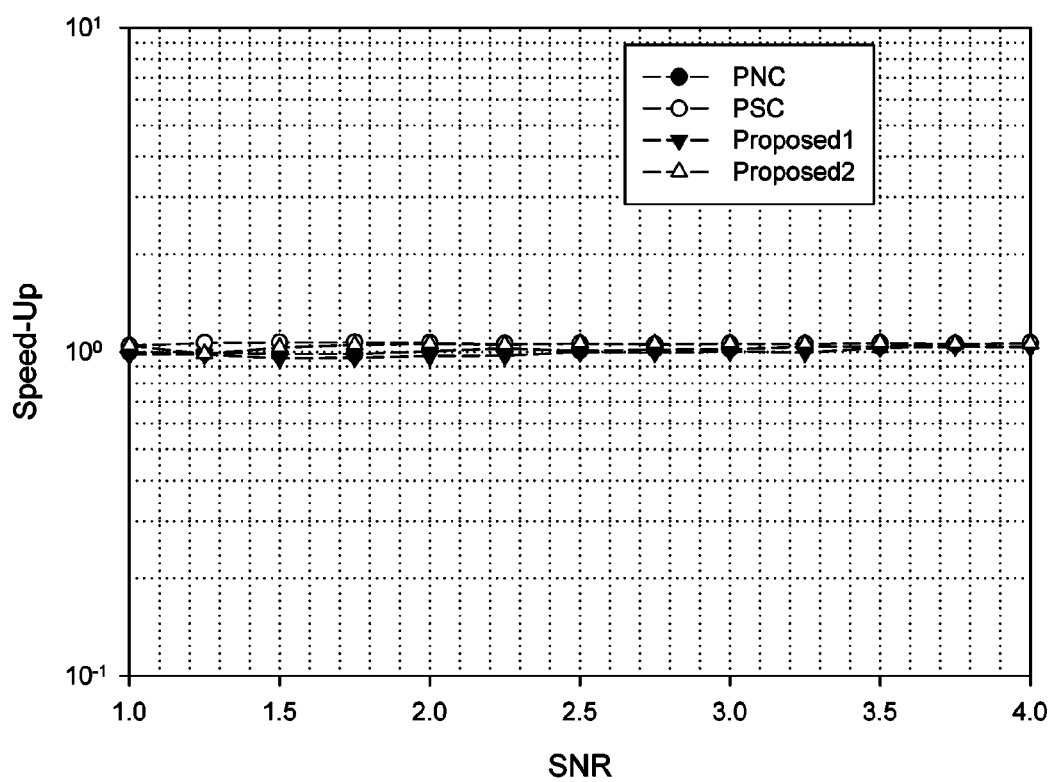
Figure 8C:
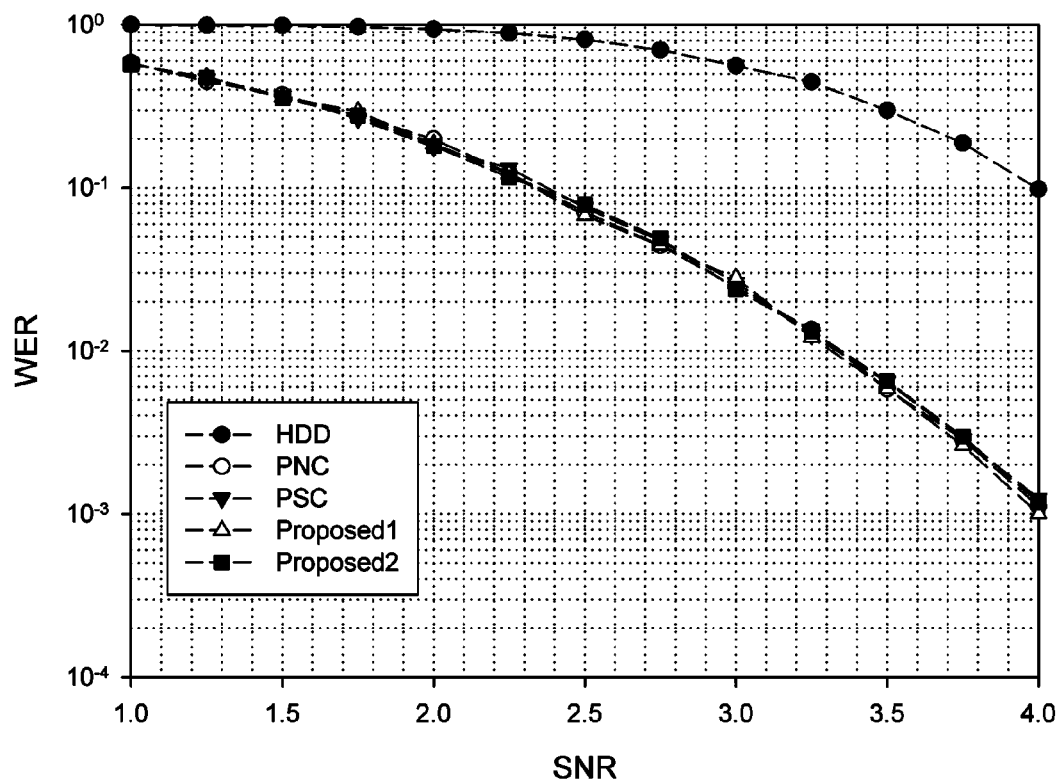
Figure 8D:
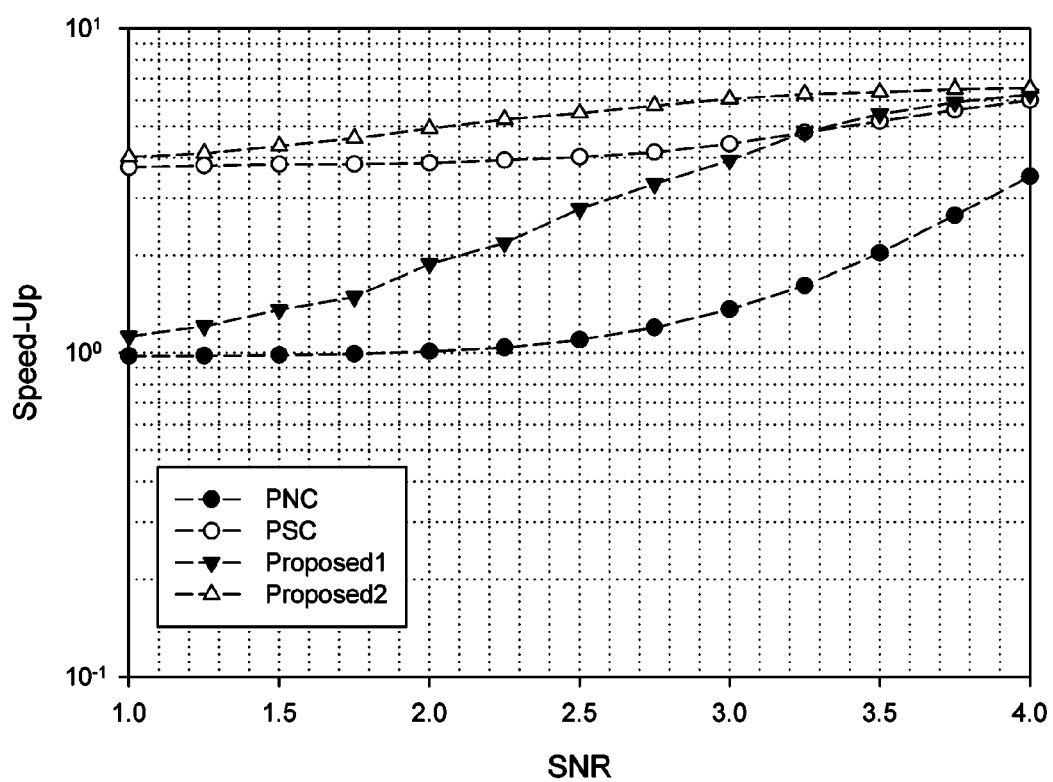
Figure 8E:
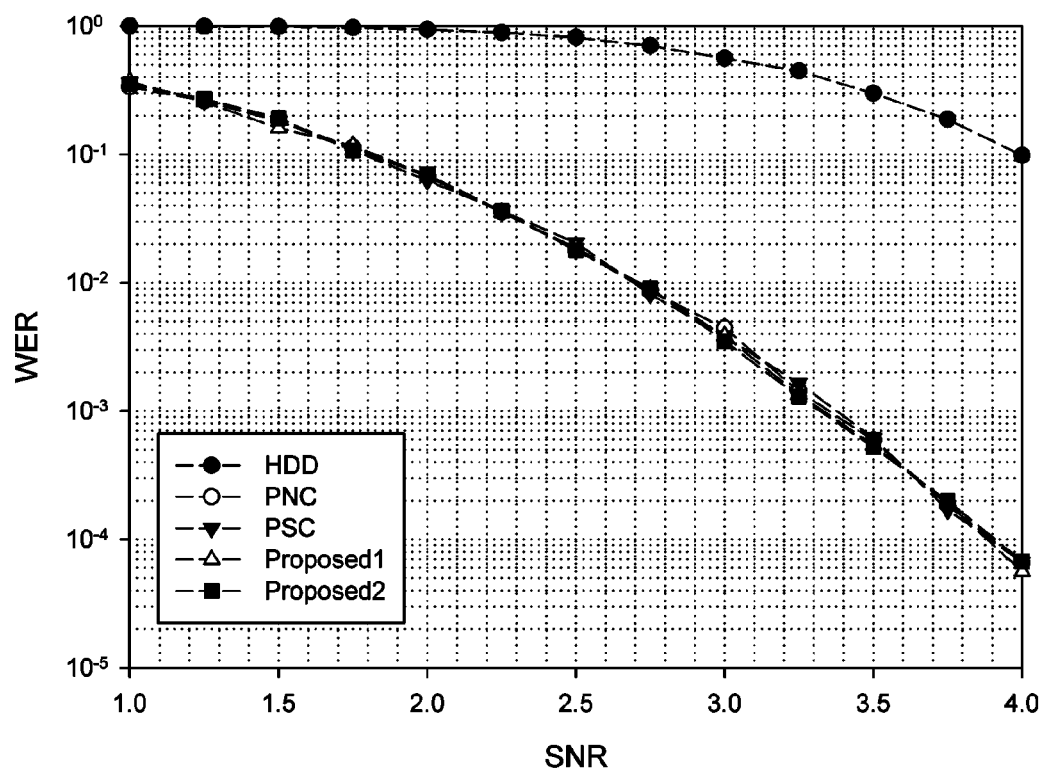
Figure 8F:
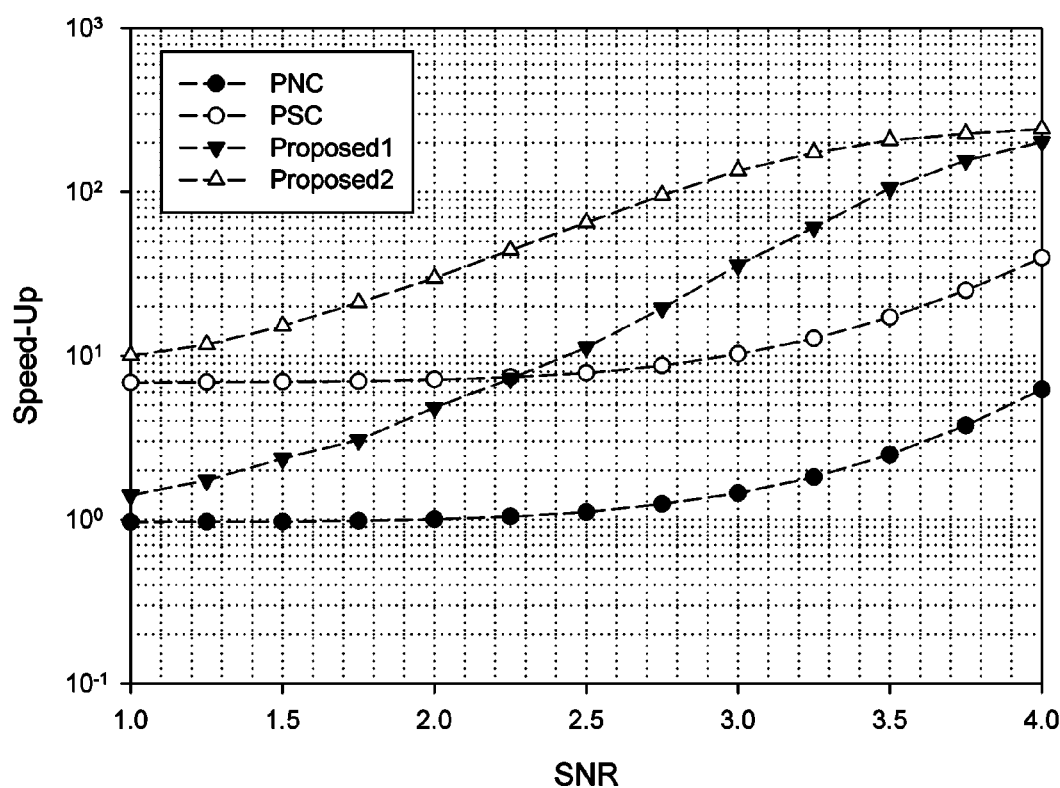
Figure 8G:
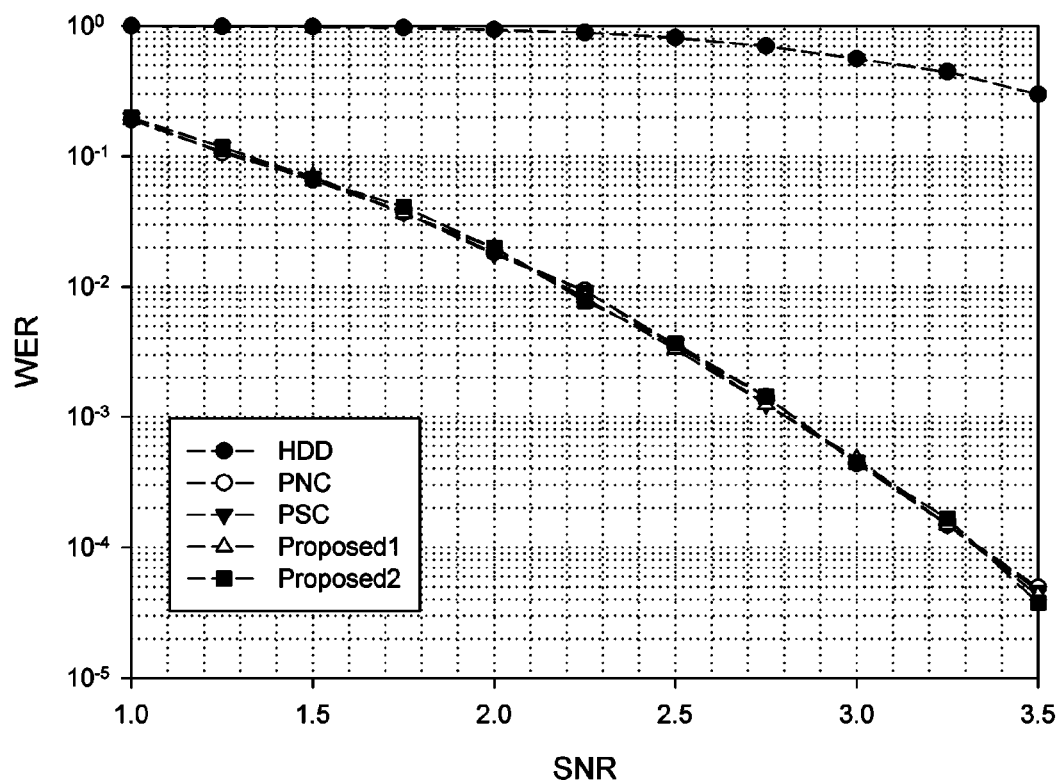
Figure 8H:
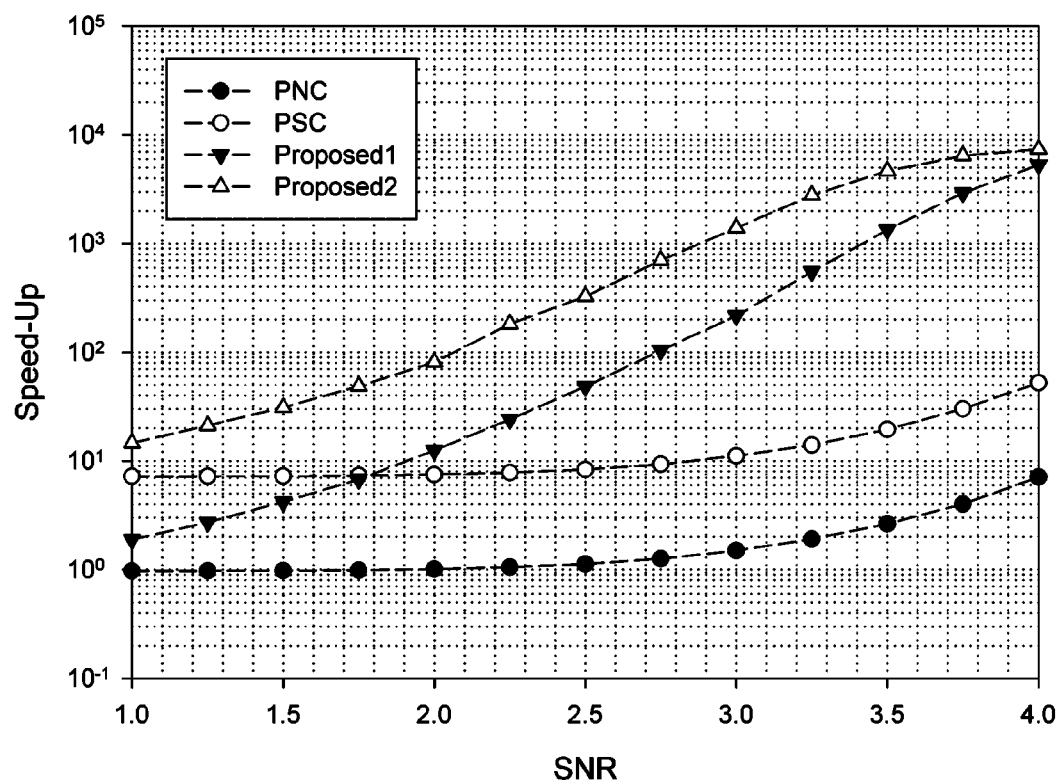

Referring to FIGS. 7C to 7D, when the value (represented by $\beta$ in the graph) of the function having the SNR, the order, and the error correction code as the factors in the method 2 (proposed 2) are changed, the decoding performance and speed for order 4 may be confirmed. In this case, the decoding speed represents a relative speed compared to the OSD-FS in order 4. From the viewpoint of the decoding performance, the same performance is exhibited before the $\beta$ value exceeds a specific value, and as the $\beta$ value increases, the decoding performance gradually decreases. The decoding speed represents a characteristic that the speed is faster and faster as the $\beta$ value increases. That is, a fine trade-off relationship between the decoding performance and the decoding speed according to the $\beta$ value is established, so a user may change parameters to suit the system environment.

FIGS. 8A to 8H are comparison graphs of the decoding performance and speed of the proposed methods according to an embodiment of the present invention under different experimental conditions.

In FIGS. 8A to 8H, a BCH code having a length of 255, a dimension of 131, and a minimum distance of 37 is used for a codeword. In addition, since the minimum distance of the HDD is 37, all errors less than or equal to 18 are set to be corrected. In this case, it is a relative indication of how fast the decoding speed is compared to the OSD-FS algorithm described in FIG. 2. In each experiment, all data was quantized into 7 bits, and the preset first threshold value according to the PSC of FIG. 4 is set to 46, and the second threshold value according to the description of FIG. 5 is set to 18. In addition, in the method 1 (proposed 1) and the method 2 (proposed 2), the values of the function f having the SNR, the order, and the error correction code as the factors are set to 706.8, 706.8, 706.8, 706.8, 706.8, 644.8, and 620.0 for orders 1 to 7, respectively.

The decoding performance of the codewords used in FIGS. 6A to 6J is no longer improved even when an order exceeds 5, but the decoding performance of the codewords used in FIGS. 8A to 8H is significantly improved when an order increases to 7. However, in the case of the PSC or the PNC, since it takes a long time even in order 5, the performances up to order 4 are compared in FIGS. 8A to 8H.

Referring to FIGS. 8A to 8H, the methods 1 and 2 show almost the same performance as the PNC and PSC in the decoding performance. On the other hand, the decoding speeds of the methods 1 and 2 are up to about 5287 times faster (method 1) and 7420 times (method 2) faster than the OSD-FS for each order, and up to about 747 times (method 1) faster and 1775 times (method 2) faster than the PNC. The decoding speeds of the methods 1 and 2 are up to about 101 times (method 1) faster and 240 times (method 2) faster than the PSC. In addition, when comparing the decoding speed by increasing the order to 5 or more, the methods 1 and 2 may be predicted to be significantly faster than the PNC or the PSC.

FIGS. 9A to 9D are graphs analyzing the decoding performance and speed according to the method 2 under different experiment conditions among the proposed methods according to an embodiment of the present invention.

The experimental conditions of FIGS. 9A to 9D are the same as those of FIGS. 8A to 8H.

Figure 9A:
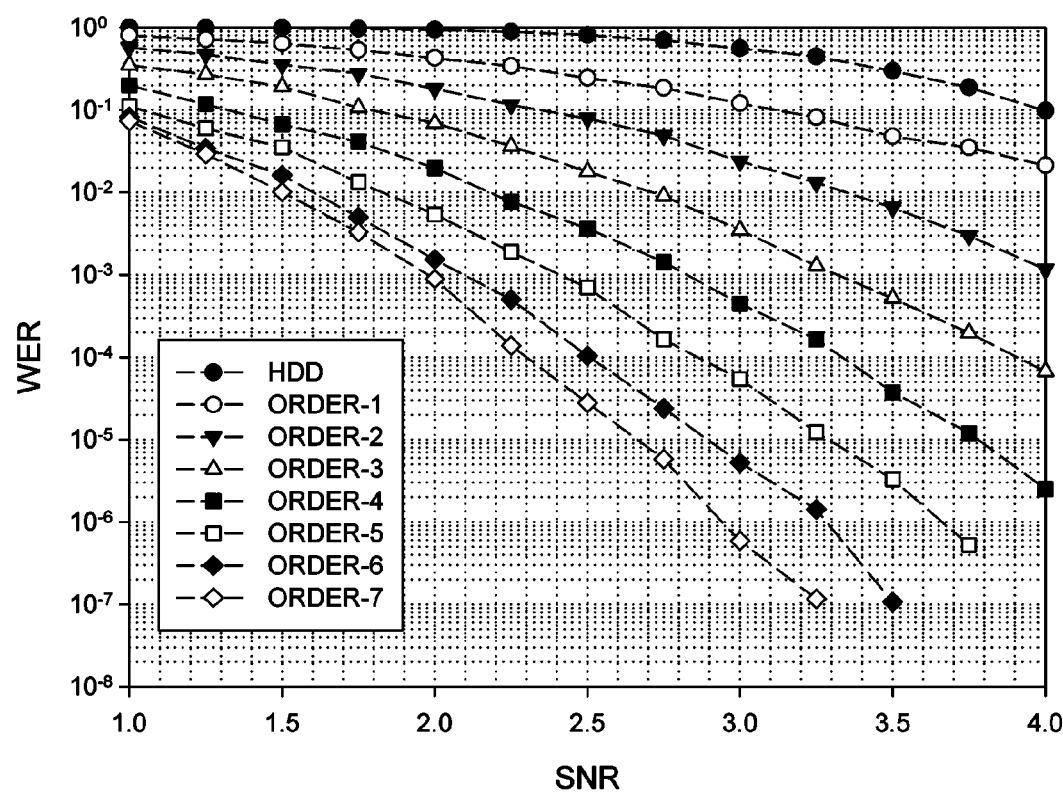
FIGS. 9A to 9D are graphs analyzing the decoding performance and speed according to the method 2 under different experiment conditions among the proposed methods according to an embodiment of the present invention.
Figure 9B:
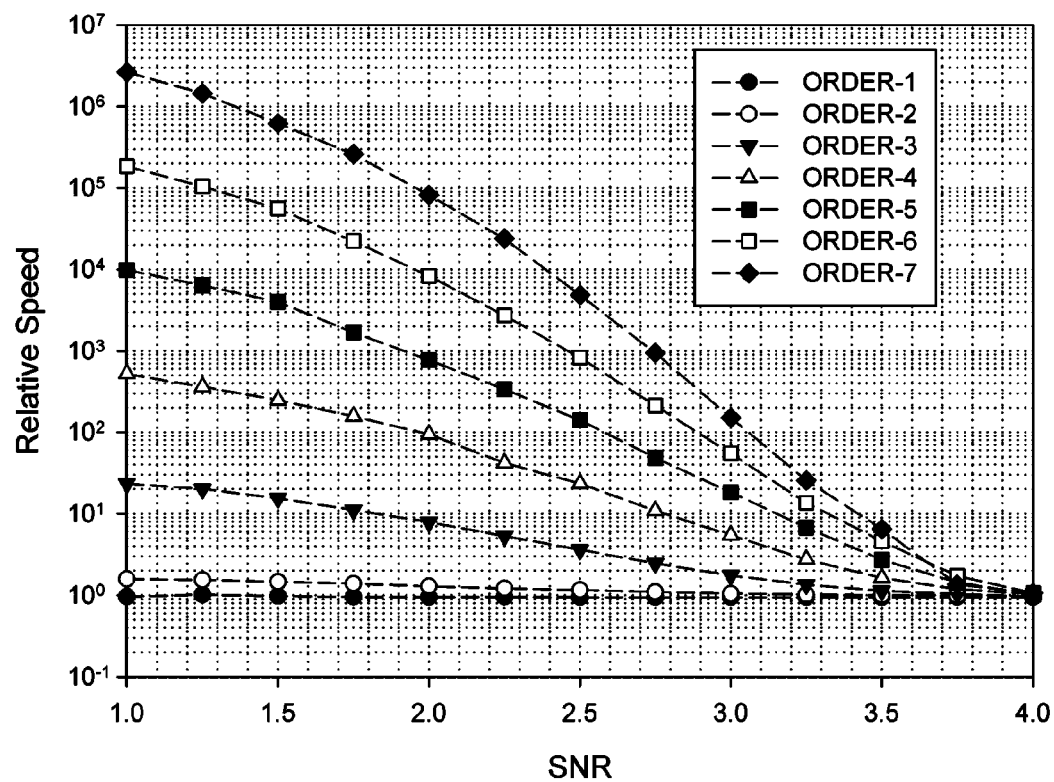

Referring to FIGS. 9A to 9B, the decoding performance and the decoding speed of the method 2 according to each order may be confirmed. In this case, the decoding speed (relative speed) illustrated in FIG. 9B represents a relative speed compared to the OSD-FS in order 1.

As can be seen in FIG. 9A, it can be seen that the decoding performance of the method 2 significantly increases as the order increases. As in FIGS. 6A to 6J, the method 2 quickly converges to the OSD-FS speed of the order 1 as the SNR increases regardless of the order. That is, when the SNR is greater than or equal to a certain level, it can be seen that the computational complexity always maintains a constant level (the lowest level) regardless of the order.

Figure 9C:
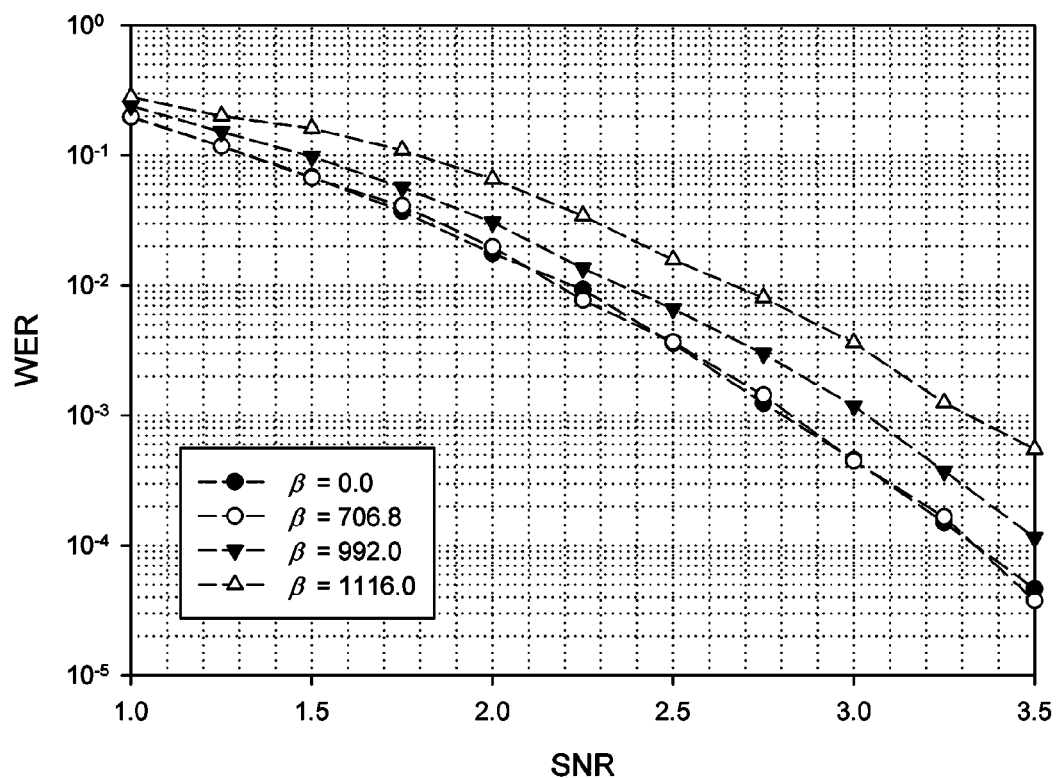
Figure 9D:
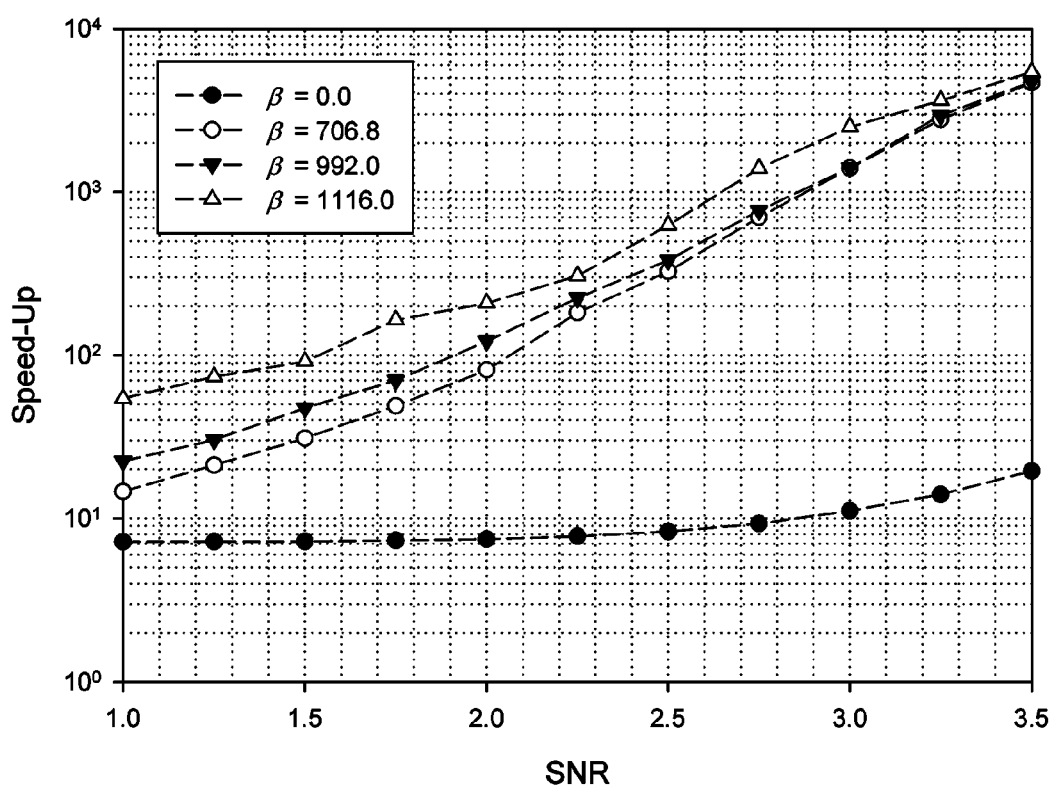

Referring to FIGS. 9C to 9D, when the value (represented by $\beta$ in the graph) of the function having the SNR, the order, and the error correction code as the factors in the method 2 (proposed 2) are changed, the decoding performance and speed for order 4 may be confirmed. Here, the decoding speed represents a relative speed compared to the OSD-FS in order 4. As in FIGS. 7A to 7D, the same decoding performance is exhibited before the $\beta$ value exceeds a specific value, and the decoding performance gradually decreases after the $\beta$ value exceeds the specific value. On the other hand, the decoding speed represents a characteristic that the speed is faster and faster as the $\beta$ value increases. By utilizing these characteristics, the user may change the parameters to suit the system environment.

Figure 10:
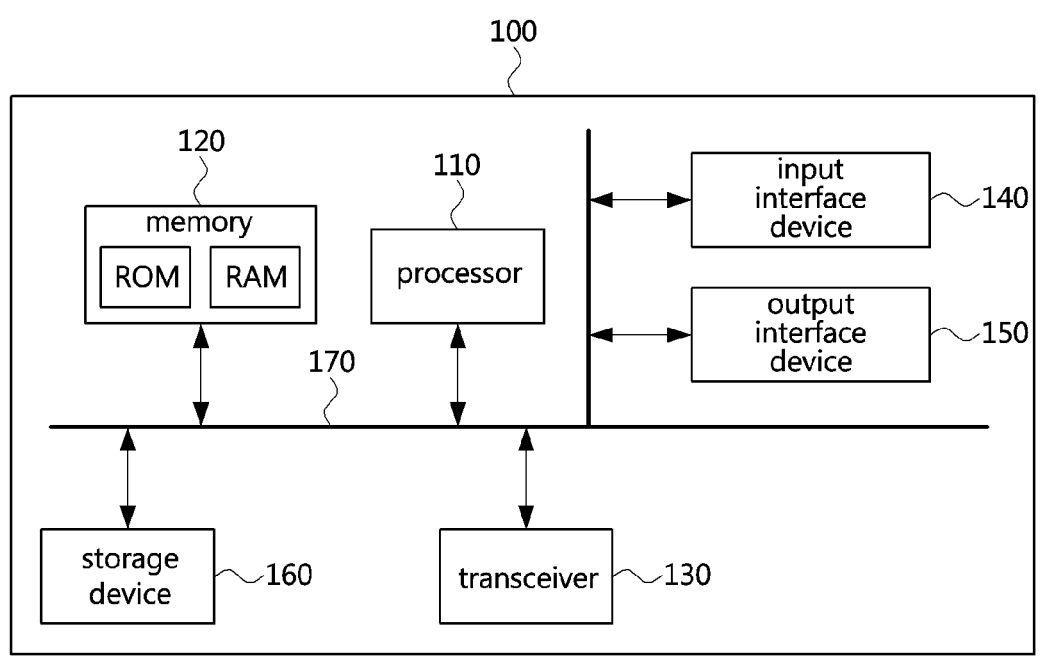
FIG. 10 is a hardware configuration diagram for an apparatus for fast decoding a linear code based on a soft decision according to an embodiment of the present invention.

FIG. 10 is a hardware configuration diagram for an apparatus for fast decoding a linear code based on a soft decision according to an embodiment of the present invention.

Referring to FIG. 10, an apparatus 100 for fast decoding a linear code based on a soft decision may include at least one processor 110 and a memory 120 for storing instructions for instructing the at least one processor 110 to perform at least one operation.

In addition, the apparatus 100 for fast decoding a linear code based on a soft decision may include a transceiver 130 that communicates with a base station through a wired/wireless network. In addition, an apparatus 100 for fast decoding a linear code based on a soft decision may further include an input interface device 140, an output interface device 150, a storage device 160, and the like. Each component included in the apparatus 100 for fast decoding a linear code based on a soft decision may be connected by a bus 170 to communicate with each other.

Here, the processor 110 may be a central processing unit (CPU), a graphics processing unit (GPU), or a dedicated processor through which methods according to embodiments of the present invention are performed. Each of the memory 120 and the storage device 160 may be configured as at least one of a volatile storage medium and a non-volatile storage medium. For example, the memory 120 may be configured as at least one of a read only memory (ROM) and a random access memory (RAM).

The at least one operation may include obtaining an arrangement signal by arranging received signals in order of magnitude, obtaining a hard decision signal by performing a hard decision on the arrangement signal, obtaining a higher signal corresponding to most reliable bases (MRBs) from the hard decision signal, obtaining a permuted and corrected codeword candidate using the higher signal and an error vector according to a current order, calculating a cost for the current order using a cost function, determining the permuted and corrected codeword candidate as a permuted and corrected codeword according to a result of comparing the calculated cost with a minimum cost, and determining a predefined speed-up condition.

The obtaining of the permuted and corrected codeword candidate may include obtaining a permuted and corrected codeword candidate by multiplying the higher signal and the error vector according to the current order with the permuted generator matrix.

The cost function may be defined as an operation of adding all the magnitudes of components corresponding to positions where the permuted and corrected codeword candidate and the hard decision signal have different values in the arrangement signal.

The error vector may be defined as a vector having the same length as the MRB and having the Hamming weight of the current order.

The determining of the predefined speed-up condition may include calculating the speed-up threshold value by adding the function having the received vector as the factor to a sum of components with a small size among the components of the arrangement signal corresponding to the MRB.

The determining of the predefined speed-up condition may further include comparing the calculated speed-up threshold value with the minimum cost.

After the comparing, only when the speed-up threshold value is smaller than the minimum cost according to a result of comparison, may the obtaining of the permuted and corrected codeword candidate for a next order of the current order be performed.

The received vector may be a vector obtained by permuting a column vector of the received signal or a vector obtained by permuting the column vector of the received signal in the same order as the permuted generator matrix.

After the obtaining of the permuted and corrected codeword candidate, the method of fast decoding a linear code based on a soft decision may include comparing a Hamming distance between the hard decision signal and the permuted and corrected codeword candidate with a preset first threshold value code.

After the comparing of the Hamming distance with the preset first threshold value, when as the result of the comparison, the Hamming distance is greater than the preset first threshold value, the obtaining of the permuted and corrected codeword candidate is performed by omitting an operation on the error vector and changing the error vector according to the current order.

After obtaining the permuted and corrected codeword candidate (or after comparing with the preset first threshold value), the method of fast decoding a linear code based on a soft decision may further include comparing a Hamming distance between the hard decision signal and the permuted and corrected codeword candidate with a preset second threshold value, and when the Hamming distance is smaller than the second threshold value, determining the permuted and corrected codeword candidate as the permuted and corrected codeword as soon as the calculating of the cost is omitted.

Examples of the apparatus 100 for fast decoding a linear code based on a soft decision may include a desktop computer, a laptop computer, a notebook, a smartphone, a tablet personal computer (PC), a mobile phone, a smart watch, smart glasses, an e-book reader, a portable multimedia player (PMP), a portable game machine, a navigation device, a digital camera, a digital multimedia broadcasting (DMB) player, a digital audio recorder, a digital audio player, a digital video recorder, a digital video player, a personal digital assistant (PDA), etc., which are capable of communication according to error correction coding.

The exemplary embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

The invention claimed is:

1. A method of fast decoding a linear code based on a soft decision, comprising:
    obtaining an arrangement signal by arranging received signals in order of magnitude;
    obtaining a hard decision signal by performing a hard decision on the arrangement signal;
    obtaining a higher signal corresponding to a most reliable base (MRB) from the hard decision signal;
    obtaining a permuted and corrected codeword candidate using the higher signal and an error vector according to a current order;
    calculating a cost for the current order using a cost function;
    determining the permuted and corrected codeword candidate as a permuted and corrected codeword according to a result of comparing the calculated cost with a minimum cost; and
    determining a predefined speed-up condition,
    wherein the determining of the predefined speed-up condition includes calculating a speed-up threshold value by adding a function having a received vector as a factor to a sum of components with a small magnitude among components of the arrangement signal corresponding to the MRB.

2. The method of claim 1, wherein the obtaining of the permuted and corrected codeword candidate includes multiplying the higher signal and the error vector according to the current order by a permuted generator matrix to obtain the permuted and corrected codeword candidate.

3. The method of claim 2, wherein the determining of the predefined speed-up condition further includes comparing the calculated speed-up threshold value with the minimum cost.

4. The method of claim 3, wherein, after the comparing, only when the speed-up threshold value is smaller than the minimum cost according to a result of comparison, is the obtaining of the permuted and corrected codeword candidate for a next order of the current order performed.

5. The method of claim 3, wherein the received vector is a vector obtained by permuting a column vector of the received signal or a vector obtained by permuting the column vector of the received signal in the same order as the permuted generator matrix.

6. The method of claim 1, wherein the cost function is defined as an operation of adding magnitudes of components corresponding to positions where the permuted and corrected codeword candidate and the hard decision signal have different values in the arrangement signal.

7. The method of claim 1, wherein the error vector has the same length as the MRB and is defined as a vector in which a Hamming weight is the current order.

8. The method of claim 1, further comprising, after the obtaining of the permuted and corrected codeword candidate, comparing a Hamming distance between the hard decision signal and the permuted and corrected codeword candidate with a preset first threshold value code.

9. The method of claim 8, wherein, after the comparing of the Hamming distance with the preset first threshold value, when the Hamming distance is greater than the preset first threshold value according to a result of the comparison, the obtaining of the permuted and corrected codeword candidate is performed by omitting an operation for the error vector and changing the error vector according to the current order.

10. The method of claim 1, further comprising:
    after the obtaining of the permuted and corrected codeword candidate,
    comparing a Hamming distance between the hard decision signal and the permuted and corrected codeword candidate with a preset second threshold value; and
    when the Hamming distance is smaller than the second threshold value, determining the permuted and corrected codeword candidate as the permuted and corrected codeword as soon as the calculating of the cost is omitted.

11. An apparatus for fast decoding a linear code based on a soft decision, comprising:
    at least one processor; and
    a memory configured to store instructions for instructing the at least one processor to perform at least one step,
    wherein the at least one step includes:
    arranging received signals in order of magnitude to obtain an arrangement signal;
    performing a hard decision on the arrangement signal to obtain a hard decision signal;
    obtaining a higher signal corresponding to a most reliable base (MRB) from the hard decision signal;
    obtaining a permuted and corrected codeword candidate using the higher signal and an error vector according to a current order;
    calculating a cost for the current order using a cost function;
    determining the permuted and corrected codeword candidate as a permuted and corrected codeword according to a result of comparing the calculated cost with a minimum cost; and
    determining a predefined speed-up condition, and
    wherein the determining of the predefined speed-up condition includes calculating a speed-up threshold value by adding a function having a received vector as a factor to a sum of components with a small magnitude among components of the arrangement signal corresponding to the MRB.

12. The apparatus of claim 11, wherein the obtaining of the permuted and corrected codeword candidate includes multiplying the higher signal and the error vector according to the current order by a permuted generator matrix to obtain the permuted and corrected codeword candidate.

13. The apparatus of claim 12, wherein the determining of the predefined speed-up condition further includes comparing the calculated speed-up threshold value with the minimum cost.

14. The apparatus of claim 13, wherein, after the comparing, only when the speed-up threshold value is smaller than the minimum cost according to a result of comparison, is the obtaining of the permuted and corrected codeword candidate for a next order of the current order performed.

15. The apparatus of claim 13, wherein the received vector is a vector obtained by permuting a column vector of the received signal or a vector obtained by permuting the column vector of the received signal in the same order as the permuted generator matrix.

16. The apparatus of claim 15, further comprising, after the obtaining of the permuted and corrected codeword candidate, comparing a Hamming distance between the hard decision signal and the permuted and corrected codeword candidate with a preset first threshold value code.

17. The apparatus of claim 16, wherein, after the comparing of the Hamming distance with the preset first threshold value, when the Hamming distance is greater than the preset first threshold value according to a result of the comparison, the obtaining of the permuted and corrected codeword candidate is performed by omitting an operation for the error vector and changing the error vector according to the current order.

18. The apparatus of claim 16, further comprising:
after the obtaining of the permuted and corrected codeword candidate,
comparing a Hamming distance between the hard decision signal and the permuted and corrected codeword candidate with a preset second threshold value; and
when the Hamming distance is smaller than the second threshold value, determining the permuted and corrected codeword candidate as the permuted and corrected codeword as soon as the calculating of the cost is omitted.

19. The apparatus of claim 11, wherein the cost function is defined as an operation of adding magnitudes of components corresponding to positions where the permuted and corrected codeword candidate and the hard decision signal have different values in the arrangement signal.

20. The apparatus of claim 11, wherein the error vector has the same length as the MRB and is defined as a vector in which a Hamming weight is the current order.

* * * * *